US010083258B2

(12) United States Patent
Kauerauf et al.

(10) Patent No.: US 10,083,258 B2
(45) Date of Patent: Sep. 25, 2018

(54) COMBINING DOWNHOLE FLUID ANALYSIS AND PETROLEUM SYSTEMS MODELING

(71) Applicant: SCHLUMBERGER TECHNOLOGY CORPORATION, Sugar Land, TX (US)

(72) Inventors: Armin I. Kauerauf, Aachen (DE); Daniel Bruno Palmowski, Wuerselen (DE); Thomas Hantschel, Aldenhoven (DE); Oliver C. Mullins, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 925 days.

(21) Appl. No.: 14/483,854

(22) Filed: Sep. 11, 2014

(65) Prior Publication Data
US 2015/0081265 A1    Mar. 19, 2015

Related U.S. Application Data

(60) Provisional application No. 61/877,437, filed on Sep. 13, 2013.

(51) Int. Cl.
*G06F 17/50* (2006.01)
*G01V 1/40* (2006.01)
*G01V 99/00* (2009.01)

(52) U.S. Cl.
CPC ............ *G06F 17/5009* (2013.01); *G01V 1/40* (2013.01); *G01V 99/005* (2013.01)

(58) Field of Classification Search
CPC ..... G06F 17/5009; G01V 1/40; G01V 99/005
(Continued)

(56) References Cited

U.S. PATENT DOCUMENTS 6,059,957 A  *  5/2000  Khan ................. C10G 47/00
                                                       208/108
7,158,887 B2 *  1/2007  Betancourt ............. E21B 49/08
                                                       702/11
(Continued)

FOREIGN PATENT DOCUMENTS

WO    2011132095 A2    10/2011

OTHER PUBLICATIONS

Al-Hajeri et al. ("Basin and Petroleum System Modeling", Oilfield Review Summer 2009, pp. 14-29).*
(Continued)

*Primary Examiner* — Kamini S Shah
*Assistant Examiner* — Iftekhar A Khan
(74) *Attorney, Agent, or Firm* — Michael Guthrie

(57) ABSTRACT

A method for performing a field operation within a geologic basin having rock formations and a reservoir that includes fluids includes generating, by forward modeling using a petroleum system model (PSM), an estimate of a fluid property distribution of a fluid within the reservoir of the geologic basin. The method further includes detecting, from fluid samples, a fluid property gradient within the geologic basin. The fluid samples are extracted from within at least one wellbore drilled through the rock formations. The method further includes, comparing the estimate of the fluid property distribution with the detected fluid property gradient to generate a comparison result, iteratively adjusting, based on the comparison result, the PSM to generate an adjusted PSM, and performing, based on the adjusted PSM, the field operation within the geologic basin.

20 Claims, 10 Drawing Sheets

(58) Field of Classification Search
USPC .......................................................... 703/10
See application file for complete search history.

(56) References Cited

U.S. PATENT DOCUMENTS

| | | | |
|---|---|---|---|
| 8,165,817 B2 | 4/2012 | Betancourt et al. | |
| 8,708,049 B2* | 4/2014 | Lawrence | E21B 49/088 166/100 |
| 8,805,614 B2* | 8/2014 | Andrews | E21B 49/082 175/50 |
| 8,826,981 B2* | 9/2014 | van Hal | E21B 49/081 166/250.12 |
| 9,097,818 B2* | 8/2015 | Hursan | G01V 3/32 |
| 9,448,322 B2* | 9/2016 | Quinn | G01V 3/38 |
| 2002/0139929 A1* | 10/2002 | Mullins | E21B 47/102 250/255 |
| 2003/0098149 A1* | 5/2003 | Wellington | E21B 7/04 166/52 |
| 2003/0106993 A1* | 6/2003 | Chen | G01V 5/12 250/269.1 |
| 2004/0020642 A1* | 2/2004 | Vinegar | B09C 1/02 166/245 |
| 2006/0155474 A1* | 7/2006 | Venkataramanan | E21B 49/00 702/13 |
| 2007/0119244 A1* | 5/2007 | Goodwin | E21B 47/10 73/152.28 |
| 2008/0040086 A1* | 2/2008 | Betancourt | E21B 49/00 703/10 |
| 2008/0125973 A1* | 5/2008 | Sherwood | E21B 49/10 702/11 |
| 2009/0192768 A1* | 7/2009 | Zuo | G01N 33/2823 703/2 |
| 2009/0248310 A1* | 10/2009 | Zuo | E21B 47/102 702/11 |
| 2009/0312997 A1* | 12/2009 | Freed | E21B 49/00 703/10 |
| 2010/0228485 A1* | 9/2010 | Betancourt | G01V 11/00 702/13 |
| 2010/0326669 A1* | 12/2010 | Zhu | G01V 11/00 166/369 |
| 2011/0088895 A1* | 4/2011 | Pop | E21B 7/04 166/254.2 |
| 2012/0029895 A1* | 2/2012 | Xi | G01V 99/005 703/10 |
| 2012/0232859 A1* | 9/2012 | Pomerantz | G01V 99/005 703/2 |
| 2013/0056395 A1* | 3/2013 | Pierre, Jr. | C10G 1/002 208/390 |
| 2013/0151159 A1* | 6/2013 | Pomerantz | E21B 49/082 702/11 |
| 2013/0218538 A1* | 8/2013 | Fuecker | G06F 17/5018 703/2 |
| 2015/0211357 A1* | 7/2015 | Chen | E21B 47/06 73/152.27 |

OTHER PUBLICATIONS

Oliver Mullins ("Discovery through Downhole Fluid Analysis", Schlumberger, 2009, pp. 1-4.*

Hantschel, et al., "Fundamentals of Basin and Petroleum Systems Modeling", Springer-Verlag Berlin Heidelberg, 6.5 (FBPSM), 2009, 157 pages.

MDT, "Modular Formation Dynamics Tester Brochure", Schlumberger; Retrieved from the Internet: URL: http://www.slb.com/services/characterization/reservoir/wireline/modular_formation_dynamics_tester.aspx.

Mullins, et al., "Integration of Basin Modeling Considerations With Wireline Logging", SPWLA-2008-NN, Society of Petrophysicists and Well-Log Analysts, 49th Annual Logging Symposium, Austin, Texas, May 25-28, 2008, 9 pages.

Mullins, et al., "Reservoir Fluid Dynamics", SPE ATCE 166083, New Orleans, 2013, 11 pages.

Mullins, "The Asphaltenes", Annual Review of Analytical Chemistry, vol. 4, Jul. 2011, pp. 393-418.

Schlumberger, "PETROMOD—Petroleum Systems Modeling Software" 2012, 28 pages.

Stainforth, et al., "New insights into Reservoir Filling and Mixing Processes" in Cubit, J.M., England, W.A, Larter, S. (Eds.) Understanding Petroleum Reservoirs: Toward and Integrated Reservoir Engineering and Geochemical Approach, Geological Society, London, Special Publication, vol. 237, 2004, pp. 115-132, 18 pages.

Extended European Search Report issued in related EP application 14184667.5 dated Jan. 5, 2016, 8 pages.

* cited by examiner

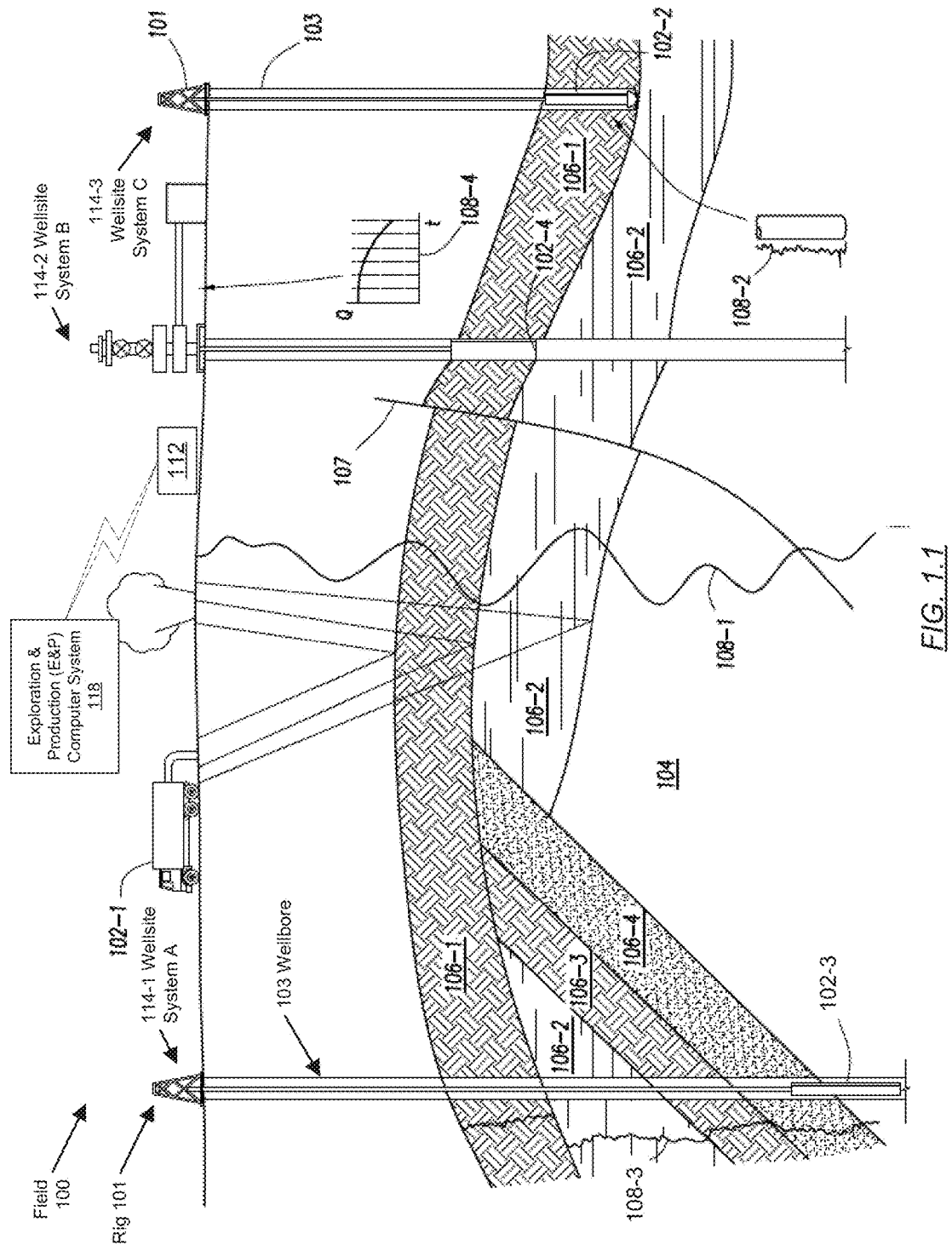
FIG. 1.1

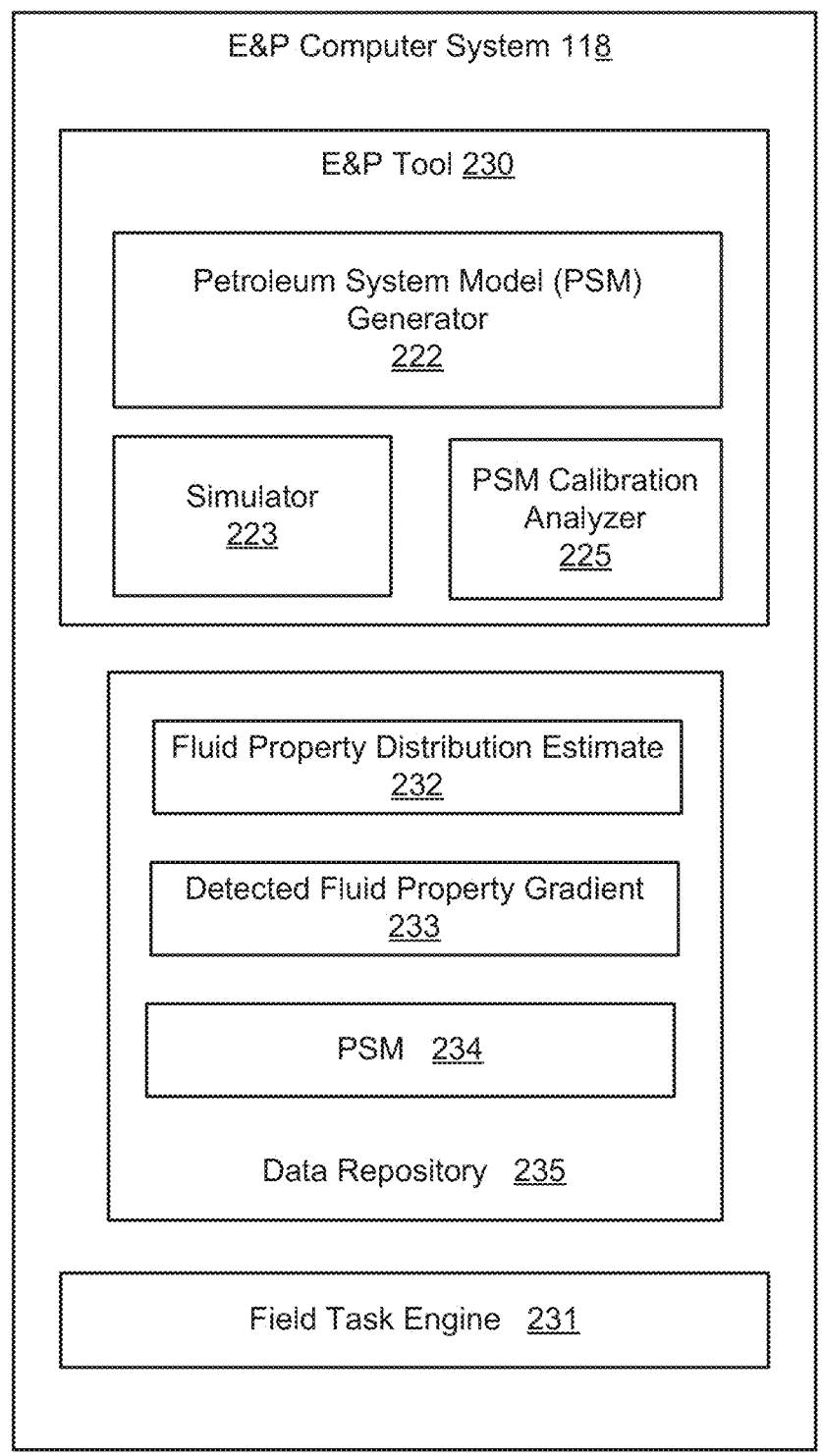
FIG. 1.2

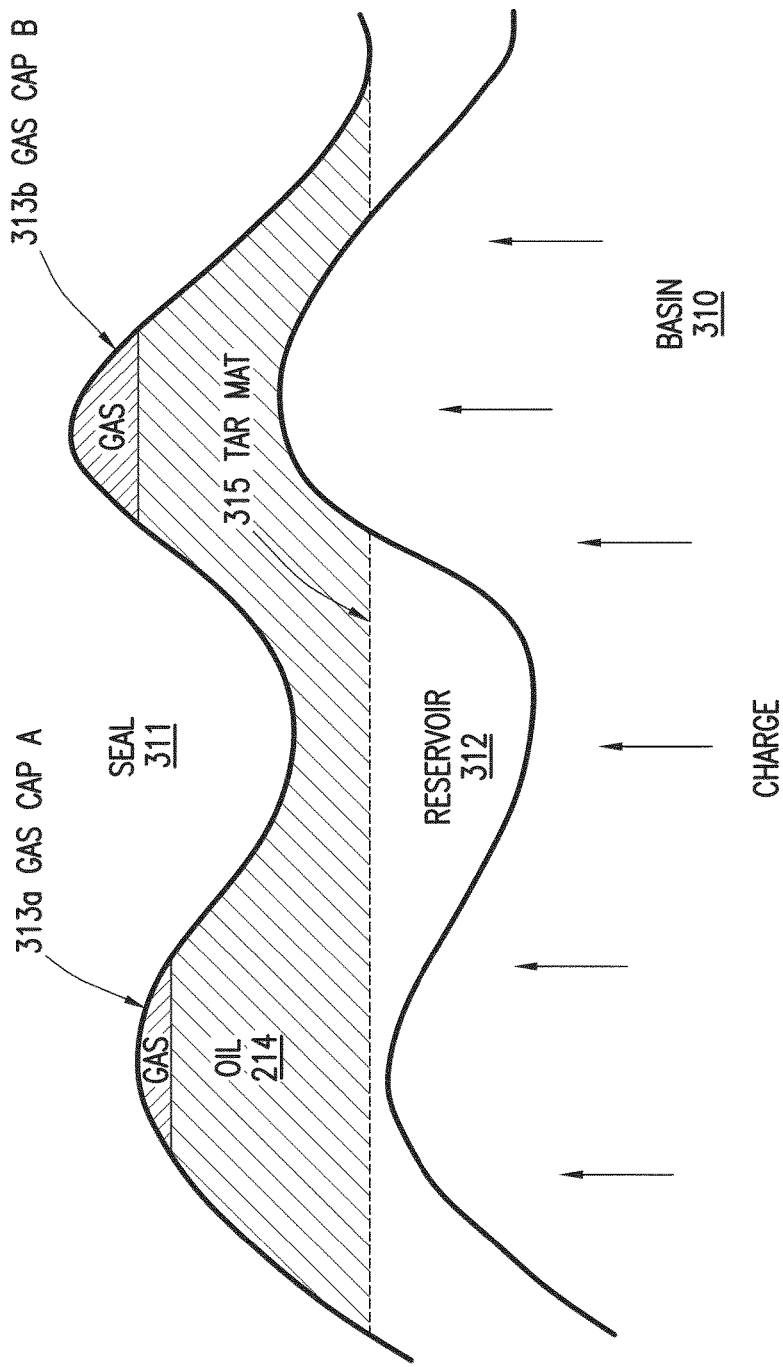
FIG.3.1

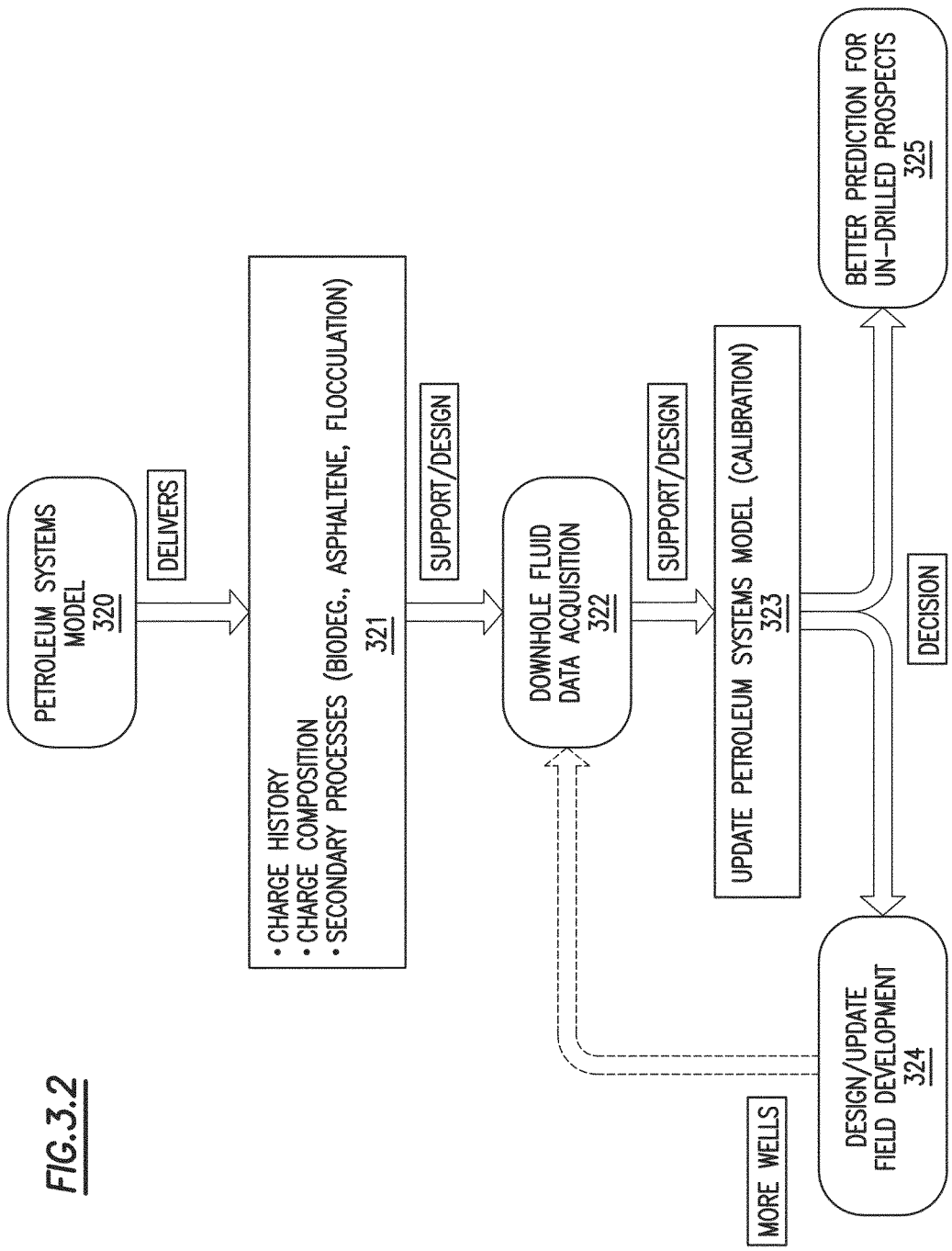

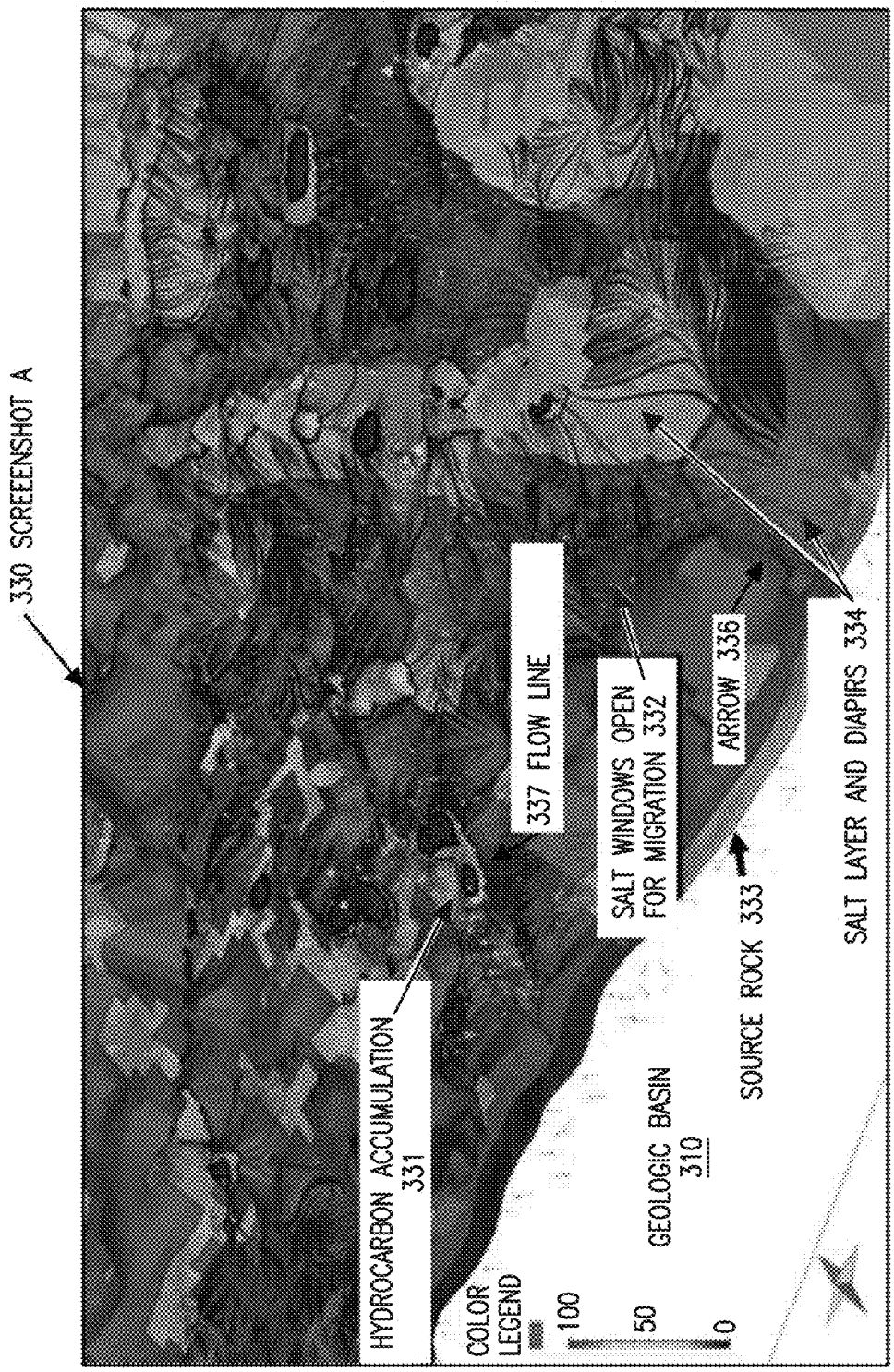
FIG.3.3

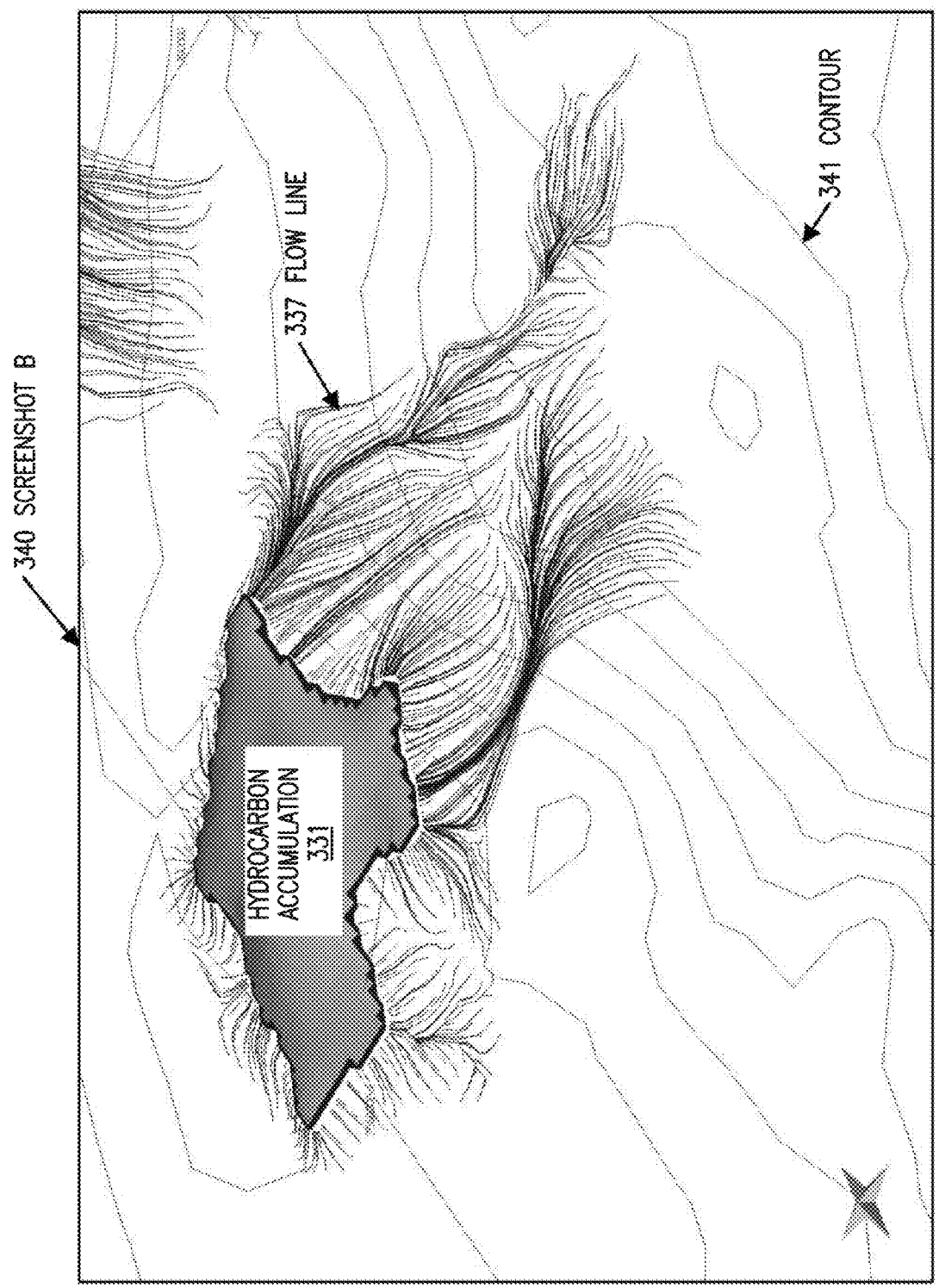
FIG. 3.4

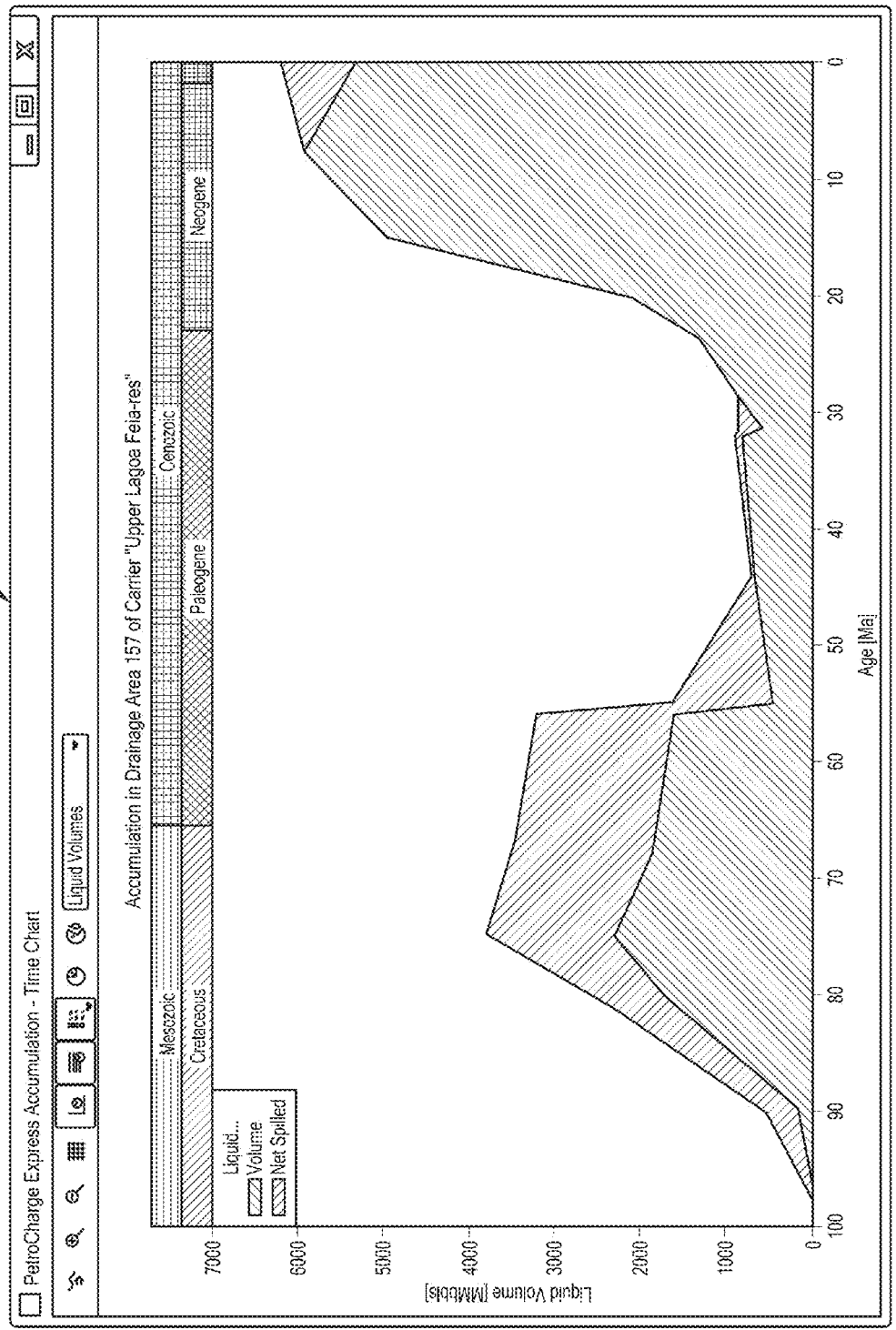
FIG. 3.5

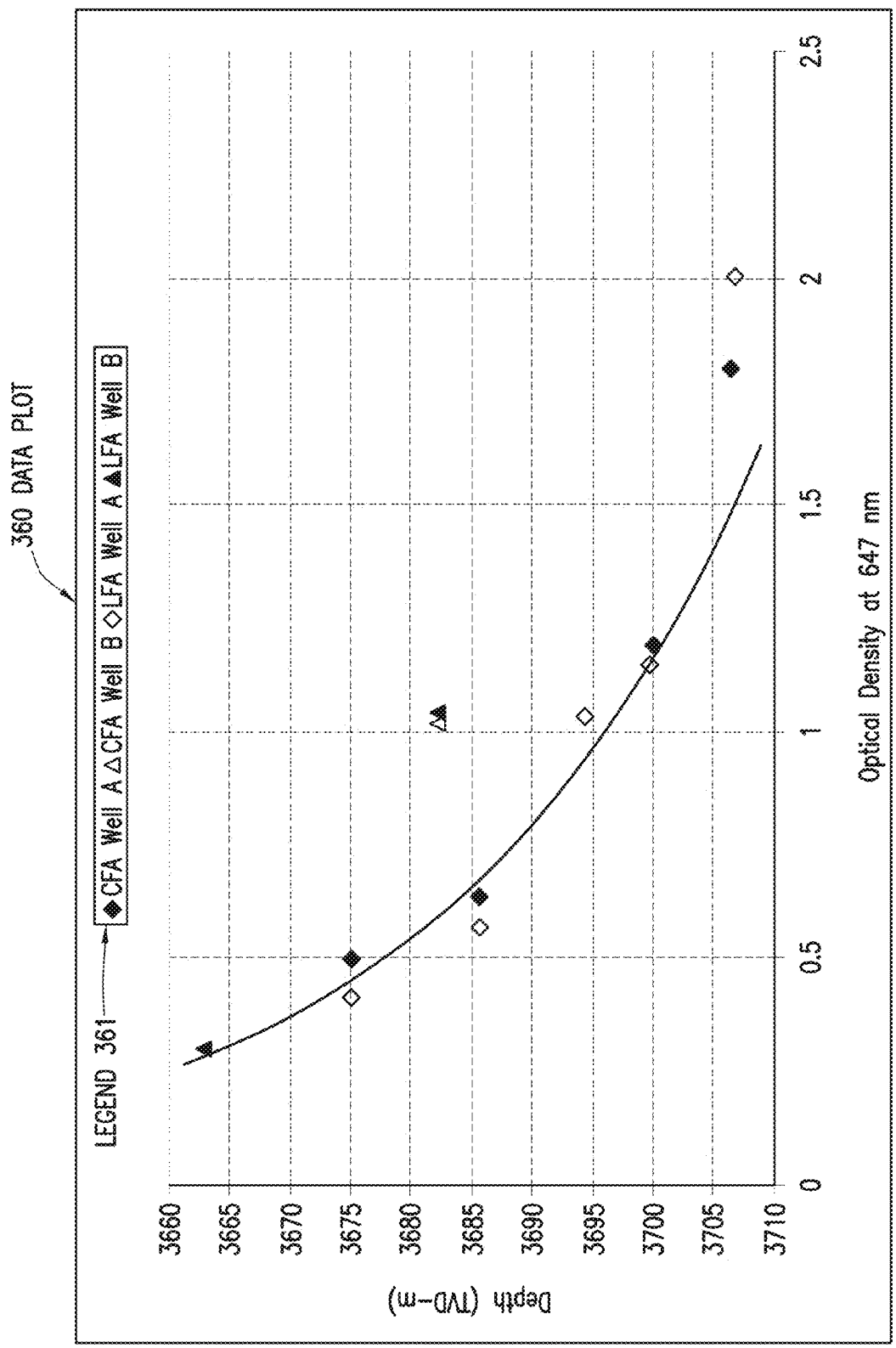
FIG.3.6

COMBINING DOWNHOLE FLUID ANALYSIS AND PETROLEUM SYSTEMS MODELING

CROSS-REFERENCE TO RELATED APPLICATIONS

This application claims the benefit of U.S. Provisional Patent Application No. 61/877,437 filed Sep. 13, 2013, entitled "IMPROVEMENT OF FIELD DEVELOPMENT AND PRODUCTION PLANNING BY A COMBINED APPLICATION OF MODULAR FORMATION DYNAMICS TESTER AND PETROLEUM SYSTEMS MODELING," which is incorporated herein by reference in its entirety.

BACKGROUND

Exploration and production (E&P) of hydrocarbons in a field, such as an oil field, may be analyzed and modeled. The analysis and modeling may include sedimentary basin simulation, subsurface hydrocarbon reservoir charge modeling, geological modeling, subsurface rock formation petrophysical properties evaluation, and downhole fluid analysis. Based on the result of the analysis and modeling, hydrocarbons may be extracted from the field. Thus, accurate models are useful for the extraction of hydrocarbons.

SUMMARY

In general, in one aspect, embodiments relate to a method for performing a field operation within a geologic basin having a rock formations and a reservoir that includes fluids. The method includes generating, by forward modeling using a petroleum system model (PSM), an estimate of a fluid property distribution of a fluid within the reservoir of the geologic basin, and detecting, from fluid samples, a fluid property gradient within the geologic basin. The fluid samples are extracted from within at least one wellbore drilled through the rock formations. The method further includes comparing the estimate of the fluid property distribution with the detected fluid property gradient to generate a comparison result, iteratively adjusting, based on the comparison result, the PSM to generate an adjusted PSM, and performing, based on the adjusted PSM, the field operation within the geologic basin.

Other aspects will be apparent from the following description and the appended claims.

BRIEF DESCRIPTION OF DRAWINGS

The appended drawings illustrate several embodiments of cross section creation and modification and are not to be considered limiting of its scope, for cross section creation and modification may admit to other equally effective embodiments.

FIG. 1.1 is a schematic view, partially in cross-section, of a field in which one or more embodiments of cross section creation and modification may be implemented.

FIG. 1.2 shows a schematic diagram of a system in accordance with one or more embodiments.

FIGS. 3.1, 3.2, 3.3, 3.4, 3.5, and 3.6 show an example in accordance with one or more embodiments.

DETAILED DESCRIPTION

Figure 2:
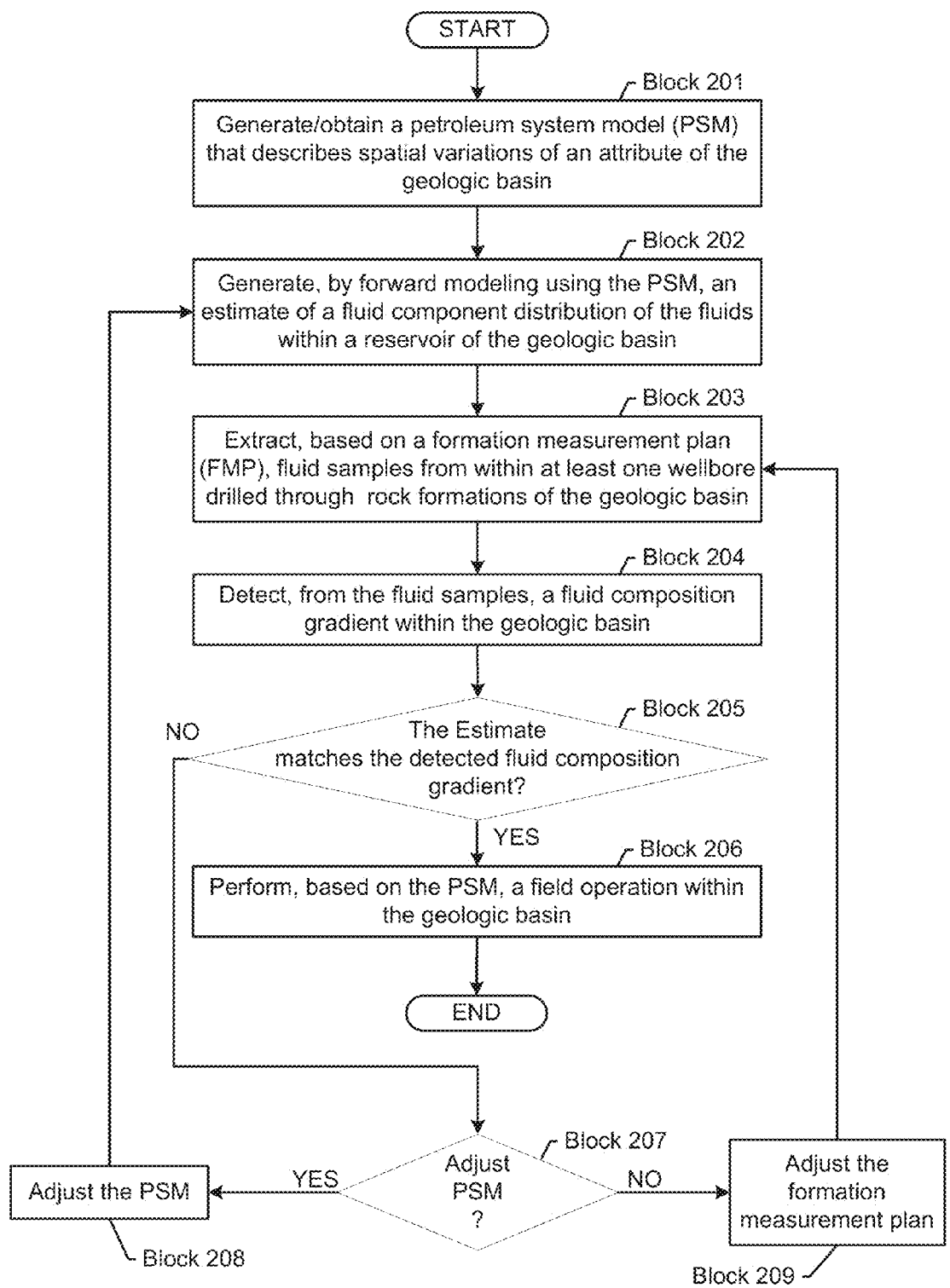
FIG. 2 shows a flowchart in accordance with one or more embodiments.

Specific embodiments will now be described in detail with reference to the accompanying figures. Like elements in the various figures are denoted by like reference numerals for consistency.

In the following detailed description of embodiments, numerous specific details are set forth in order to provide a more thorough understanding. However, it will be apparent to one of ordinary skill in the art that one or more embodiments may be practiced without these specific details. In other instances, well-known features have not been described in detail to avoid unnecessarily complicating the description.

In general, embodiments provide a method and system for performing a field operation within a geologic basin having multiple rock formations and a reservoir that includes fluids, such as hydrocarbons. In particular, an estimate of a fluid property distribution of a fluid within the reservoir of the geologic basin is generated by forward modeling using a petroleum system model (PSM). From fluid samples extracted from rock formations, a fluid property gradient is detected within the geologic basin. Accordingly, the estimate of the fluid property distribution is compared with the detected fluid property gradient to generate a comparison result. Based on the comparison result, the PSM is iteratively adjusted to generate an adjusted PSM. Based on the adjusted PSM, the field operation is performed within the geologic basin.

In one or more embodiments, different types of measurements of subsurface rock formations and related interpretation methods are integrated to evaluate probable spatial distribution and variations of hydrocarbons within a geologic basin (e.g., sedimentary basin). Based on such evaluation, uncertainty is reduced during the exploration and appraisal of oil and gas reservoirs. In one or more embodiments, the measurements and interpretation are used to calibrate a petroleum system model of the geologic basin, which is in turn used for the evaluation and appraisal of the reservoirs.

FIG. 1.1 depicts a schematic view, partially in cross section, of a field (100) in which one or more embodiments of cross section creation and modification may be implemented. In one or more embodiments, one or more of the modules and elements shown in FIG. 1.1 may be omitted, repeated, and/or substituted. Accordingly, embodiments of cross section creation and modification should not be considered limited to the specific arrangements of modules shown in FIG. 1.1.

As shown in FIG. 1.1, the field (100) includes the subterranean formation (104), data acquisition tools (102-1), (102-2), (102-3), and (102-4), wellsite system A (114-1), wellsite system B (114-2), wellsite system C (114-3), a surface unit (112), and an exploration and production (E&P) computer system (118). The subterranean formation (104) includes several geological structures, such as a sandstone layer (106-1), a limestone layer (106-2), a shale layer (106-3), a sand layer (106-4), and a fault line (107). A portion of the subterranean formation (104) may be a geologic basin, such as a sedimentary basin. In particular, the geologic basin includes rock formations and at least one reservoir containing fluids. An example of the geologic basin is described in reference to FIG. 3.1 below.

By way of further discussion of the geologic basin and basin modeling techniques, geologic sedimentary basin is a depression in the surface of the Earth's crust that undergoes infilling with sediment deposits. Such sediments are derived from weathered rock formations, from biogenic activity, from precipitation of minerals from solution and combinations of the foregoing. When deposited sediments are buried, the sediments are subjected to increasing pressure and temperature. Such burial and subjecting to elevated pressure and temperature begin the process of lithification, which is conversion of unconsolidated sediments into rock formations.

Petroleum (i.e., oil and gas) may be formed within a basin by chemical reactions of sedimentary biogenic precursor material. After generation, petroleum is spatially distributed within the basin via permeable pathways until the petroleum accumulates within porous and permeable reservoir rock formations, or the petroleum is dissipated by chemical or biochemical reactions, or leakage to the surface of the basin. Within any particular basin, there may be one or more "plays" for possible production of hydrocarbons. The U.S. Geological Survey defines a "play" as "a set of discovered or undiscovered oil and gas accumulations or prospects that exhibit nearly identical geological characteristics such as trapping style, type of reservoir and nature of the seal." A reservoir may include several different accumulations which differ from each other by the nature of the fluids within the pore spaces of the rock formations and/or the pressure thereof. A "reservoir" is a rock formation with substantially uniform rock mineral properties and spatial distribution of permeability such that the rock formation has the capability to store fluids, and has the capability for fluids to be moved therethrough by application of suitable pressure variations.

Petroleum system modeling (also referred to as basin modeling) is a technique that provides for reconstruction of geological processes that may have occurred in sedimentary basins over geological times, and more specifically the events leading to generation, migration and accumulation of hydrocarbons in reservoir rocks. Inputs to basin modeling include the "charge potential" (source rock fractional hydrocarbon precursor content, source rock thickness, and hydrocarbon maturity), and the trap (the reservoir geometry, reservoir and seal qualities) of a prospect or play. The thermal, pressure and hydrocarbon generation and migration history are also modeled to make predictions of current hydrocarbon quality and spatial distribution within the basin. The description of petroleum fluids in basin modeling is determined, at least in part, by the processes of generation and expulsion that govern the overall composition of the fluids, and the pressure, volume and temperature ("PVT") behavior responsible for the distribution of components in each fluid phase during secondary migration and accumulation in a reservoir. The charge history of an accumulation or an individual reservoir may be tracked in compositional form according to selected compound classes, for example, $CO_2$, $H_2S$, methane, $C_{2-5}$, $C_{6-15}$, $C_{16+}$. Thermodynamic models known as equations of state, e.g., SRK (Soave-Redlich-Kwong) and Peng-Robinson, may be used to make phase property predictions such as gas-oil ratio (GOR), fluid density and/or fluid viscosity. Post-accumulation alteration processes such as biodegradation, water washing, and oil-to-gas cracking may also be simulated. Source rock tracking, the evolution of the composition through time, yields and compositions of the products generated and released may also be modeled. The aforementioned basin modeling simulations may be performed using a commercially available basin simulation software package, for example, one sold under the trademark PETROMOD®, which is a registered trademark of Western Geco, LLC, 10001 Richmond Avenue, Houston, Tex. 77042. The foregoing software has the capability for the user to modify fluid data to calibrate the fluid model. Hydrocarbons are described in the basin simulation software using a limited number of components, e.g., up to 14 components. It is also customary to lump several components into one or more pseudo components (e.g., $C_{2-6}$, $C_{15+}$) to reduce computation time and memory consumption.

The present day hydrocarbon composition may depend chiefly on the quality of the precursor organic matter (the kerogen) and the processes of petroleum generation within the source rock. The controlling mechanisms for the formation of the hydrocarbons include the petroleum generation potential of the source rock and the burial history. In particular, the petroleum generation potential of the source rock is determined by the total organic (non carbonate) carbon (TOC) and the hydrogen index (HI). In addition, the burial history determines the temperature history that regulates the multitude of chemical reactions occurred over geologic time to transform the kerogen into petroleum components. For example, one technique for describing the petroleum generation process is by Arrhenius type reaction schemes. In such case, the model parameters are the Activation Energy, which describes the threshold energy required to initiate the reaction, and the Frequency Factor (also known as pre-exponential factor), which, in theory, represents the frequency at which the molecules will be transformed. Since many reactions take place, several activation energy and frequency factor values may exist. The frequency factor may be considered as constant due to its weaker dependence on temperature. The activation energy may be represented by a discrete probability distribution. The corresponding frequency factors and activation energies may roughly be determined by the organofacies, i.e., an empirical description of the type of the precursor material (e.g., kerogne), concentration, and depositional processes, and the precursor material's relation to present day hydrocarbon composition. Hydrocarbon generation models are based on the analysis of source rock samples or on suitable geological assumptions about the history of a sedimentary basin. Such models may include a distribution of organofacies, with appropriate frequency factors and activation energies, and the amount of precursor material, which is specified by TOC and HI maps.

The spatial and temporal extent covered by typical basin models is larger than for reservoir simulation models. Therefore, the spatial and temporal resolution of basin models is lower than that required for reservoir simulation. Some post-migration processes that affect the quality of the hydrocarbon, such as biodegradation and water washing, may be better modeled at the basin scale; however, another process that occurs at the reservoir scale and that affects the production of hydrocarbons from any particular reservoir is the mixing of hydrocarbon species. The nature of the hydrocarbons generated in the source rock varies with geological time, a result of the burial and thermal history of the basin. Longer chain hydrocarbons (heavy components) may be expelled first followed by shorter chain hydrocarbons (lighter components). In basin modeling, fluid composition is sometimes presumed to be homogenous throughout the accumulation, i.e., the chemical components are well mixed throughout the hydrocarbon column. However, in addition to biodegradation and temperature gradients, variations in fluid composition within an accumulation may be a result of the charge history and may even reflect active charging. See, for example, Mullins, O. C., Elshahawi, H., Stainforth, J. G., Integration of Basin Modeling Considerations with Wireline Logging, SPWLA 49th Annual Logging Symposium, Edinburgh, Scotland, May 25-28, 2008 and J. G. Stainforth, New Insights into Reservoir Filling and Mixing Processes in J. M. Cubit, W. A. England, S. Larter, (Eds.) Understanding Petroleum Reservoirs: toward and Integrated Reservoir Engineering and Geochemical Approach, Geological Society, London, Special Publication, (2004).

Translating the present distribution of hydrocarbons in an accumulation to relevant parameters in the basin model helps reduce uncertainty as to the spatial distribution of hydrocarbon species. Fluid properties are one of the elements of basin modeling since the fluid properties are a direct consequence of the series of events that took place over geologic time from the origin of the hydrocarbon. One way to determine fluid properties is by lowering a sample taking instrument into a wellbore drilled through the relevant rock formations and withdrawing a sample of the fluid from the rock formation under particular conditions. The foregoing technique enables the acquisition of fluid samples very close to the native reservoir pressure and temperature, therefore maximizing the likelihood that the samples are representative of the fluid existing in the particular reservoir. Furthermore, some analyses of the fluid in subsurface formations may be performed as the fluid enters the sample taking instrument, minimizing the risk of sample fouling and providing a device for identifying the fluid that may be used for tracking the sample during subsequent analyses in the laboratory. Certain fluid features such as $H_2S$, $CO_2$, and asphaltene content are determined in the downhole to avoid irreversible transitions during the sample transportation to the laboratory that lead to inaccurate measurements. Samples may be taken by such instruments at several depths along the wellbore, therefore the foregoing technique may provide the level of spatial resolution required to resolve fluid composition variations at the reservoir scale. Methods used for the analysis of reservoir fluids in the wellbore include visible-near-infrared absorption spectroscopy, gas chromatography, mass spectroscopy, nuclear magnetic resonance (NMR), and other sensors, to determine composition (e.g., fractional amounts of $H_2S$, $CO_2$, $C_1$, $C_2$, $C_3$, $C_4$, $C_5$, $C_6$, etc.), gas-oil ratio, distribution of hydrocarbon fractions based on carbon number and compound classes (saturates, aromatics, resins, paraffins, naphtenes, and asphaltenes), fluid density, fluid viscosity, saturation pressure, and identification of certain biomarkers. Density and viscosity of fluid samples may be measured in the downhole sampling tool at different pressures to obtain a better characterization of the PVT behavior of the fluid. The foregoing technique also enables reliable assessment of asphaltene content in petroleum. Another technique based on nuclear magnetic resonance enables an analysis of the fluids within the rock to estimate distribution of hydrocarbon fractions based on carbon number, gas-oil ratio, and relative ratios of hydrocarbon compound classes. Combination of both in situ analysis and analysis of the fluid as the fluid is withdrawn into the sample taking instrument allows a more complete characterization of the fluid and provides immediate results that may be used to optimize the data acquisition process while the sampling tool is still in the well. The fluid properties that may be determined by the foregoing analyses are consistent with the level of detail of the fluid information required for basin simulation.

High-resolution laboratory measurements provide additional details on the chemistry of the downhole fluid samples also relevant for basin modeling. Such techniques include high field $^{13}C$ and $^1H$ nuclear magnetic resonance, high resolution mass spectroscopy, two-dimensional gas chromatography (GC*GC), sulfur X-ray absorption near edge structure (XANES) and carbon X-ray Raman spectroscopy. The results obtained with such techniques may be combined with the downhole fluid analyses for probing further on the nature of the fluids, comparing samples (compositional variations), identifying sample source, identifying post-migration processes like water washing and biodegradation, and analyzing the heavy fraction of crude oil, which bears the most chemical resemblance with the kerogen that produced the present-day hydrocarbon. Prior to the laboratory analyses, downhole fluid samples should be subject to a chain of custody procedure, consisting of reconditioning the sample to the same conditions of pressure and temperature prevailing during the acquisition of the sample in the downhole, analysis of a subset of the fluid sample using the same techniques employed in the downhole environment, and comparison of the laboratory and downhole results to determine the quality of the sample, i.e., preservation of the chemical composition.

Downhole fluid analyses (DFA) is the technique to analyze fluids withdrawn from a reservoir using VIS-NIR spectroscopy, NMR, gas chromatography and other sensors, in situ fluid analyses with NMR, and pressure and temperature gradient measurements. DFA may provide the following information: (a) fluid composition, compound classes (saturates, aromatics, resins, asphaltenes, paraffins, naphtenes), density, viscosity, (b) fluid composition and pressure variations between stratigraphic units. This provides information on the level of compartmentalization of the accumulation; (c) fluid composition variations within the same layer. Fluid composition variations may be observed within the same layer in thick intervals and when drilling along a reservoir (geo-steered wells). Special chemical analysis in the laboratory may provide more detailed information on the nature of the hydrocarbons: (a) principal chemical classes present in the sample; (b) gas isotopes (c) presence of heavy metals, etc. Analysis of the chemistry of larger molecules (the heavy fraction of crude oil) may provide information concerning: (a) similarity between fluids analyzed at different spatial locations; (b) chemical composition of the precursor material (kerogen)

The information described above regarding the level of mixing of hydrocarbon species within an accumulation, the possible origin of the hydrocarbons, the level of hydrocarbon maturation, and whether the hydrocarbon has been subject to biodegradation or water washing are components of basin modeling.

Fluid analysis in the reservoir and laboratory analyses have been used in reservoir exploration/appraisal to help determine the reservoir structure. Fluid pressure data are used to assess the areal and vertical continuity of specific reservoir units. A fluid model that uses the fluid features observed as input may be combined with the geological model of the reservoir. Since field appraisal and development may occur at a faster pace than exploration, it is desirable to be able to predict fluid properties at the locations of wellbores expected to be drilled to facilitate real time analysis and continuous update of the geological model.

Returning to the discussion of FIG. 1.1, in one or more embodiments, data acquisition tools (102-1), (102-2), (102-3), and (102-4) are positioned at various locations along the field (100) for collecting data of the subterranean formation (104), referred to as survey operations. In particular, the data acquisition tools are adapted to measure the subterranean formation (104) and detect the characteristics of the geological structures of the subterranean formation (104). For example, data plots (108-1), (108-2), (108-3), and (108-4) are depicted along the field (100) to demonstrate the data generated by the data acquisition tools. Specifically, the static data plot (108-1) is a seismic two-way response time. Static plot (108-2) is core sample data measured from a core sample of the formation (104). Static data plot (108-3) is a logging trace, referred to as a well log. Production decline curve or graph (108-4) is a dynamic data plot of the fluid flow rate over time. Other data may also be collected, such as historical data, analyst user inputs, economic information, and/or other measurement data and other parameters of interest.

Further as shown in FIG. 1.1, each of the wellsite system A (114-1), wellsite system B (114-2), and wellsite system C (114-3) is associated with a rig, a wellbore, and other wellsite equipment configured to perform wellbore operations, such as logging, drilling, fracturing, production, or other applicable operations. For example, the wellsite system A (114-1) is associated with a rig (101), a wellbore (103), and drilling equipment to perform drilling operation. Similarly, the wellsite system B (114-2) and wellsite system C (114-3) are associated with respective rigs, wellbores, other wellsite equipments, such as production equipment and logging equipment to perform production operation and logging operation, respectively. Generally, survey operations and wellbore operations are referred to as field operations of the field (100). In addition, data acquisition tools and wellsite equipments are referred to as field operation equipments. The field operations are performed as directed by a surface unit (112). For example, the field operation equipments may be controlled by a field operation control signal send from the surface unit (112).

In one or more embodiments, the surface unit (112) is operatively coupled to the data acquisition tools (102-1), (102-2), (102-3), (102-4), and/or the wellsite systems. In particular, the surface unit (112) is configured to send commands to the data acquisition tools (102-1), (102-2), (102-3), (102-4), and/or the wellsite systems and to receive data therefrom. In one or more embodiments, surface unit (112) may be located at the wellsite system A (114-1), wellsite system B (114-2), wellsite system C (114-3), and/or remote locations. The surface unit (112) may be provided with computer facilities (e.g., an E&P computer system (118)) for receiving, storing, processing, and/or analyzing data from the data acquisition tools (102-1), (102-2), (102-3), (102-4), the wellsite system A (114-1), wellsite system B (114-2), wellsite system C (114-3), and/or other part of the field (104). The surface unit (112) may also be provided with or functionally for actuating mechanisms at the field (100). The surface unit (112) may then send command signals to the field (100) in response to data received, stored, processed, and/or analyzed, for example to control and/or optimize various field operations described above.

In one or more embodiments, the surface unit (112) is communicatively coupled to the E&P computer system (118). In one or more embodiments, the data received by the surface unit (112) may be sent to the E&P computer system (118) for further analysis. Generally, the E&P computer system (118) is configured to analyze, model, control, optimize, or perform management tasks of the aforementioned field operations based on the data provided from the surface unit (112). In one or more embodiments, the E&P computer system (118) is provided with functionality for manipulating and analyzing the data, such as performing seismic interpretation or borehole resistivity image log interpretation to identify geological surfaces in the subterranean formation (104) or performing simulation, planning, and optimization of production operations of the wellsite system A (114-1), wellsite system B (114-2), and/or wellsite system C (114-3). In one or more embodiments, the result generated by the E&P computer system (118) may be displayed for analyst user viewing using a two dimensional (2D) display, three dimensional (3D) display, or other suitable displays. Although the surface unit (112) is shown as separate from the E&P computer system (118) in FIG. 1.1, in other examples, the surface unit (112) and the E&P computer system (118) may also be combined.

Although FIG. 1.1 shows a field (100) on the land, the field (100) may be an offshore field. In such a scenario, the subterranean formation may be in the sea floor. Further, field data may be gathered from the field (100) that is an offshore field using a variety of offshore techniques for gathering field data.

FIG. 1.2 shows more details of the E&P computer system (118) in which one or more embodiments of cross section creation and modification may be implemented. In one or more embodiments, one or more of the modules and elements shown in FIG. 1.2 may be omitted, repeated, and/or substituted. Accordingly, embodiments of cross section creation and modification should not be considered limited to the specific arrangements of modules shown in FIG. 1.2.

As shown in FIG. 1.2, the E&P computer system (118) includes an E&P tool (230), a data repository (235) for storing intermediate data and resultant outputs of the E&P tool (230), and a field task engine (231) for performing various tasks of the field operation. In one or more embodiments, the data repository (235) may include one or more disk drive storage devices, one or more semiconductor storage devices, other suitable computer data storage devices, or combinations thereof. In one or more embodiments, content stored in the data repository (235) may be stored as a data file, a linked list, a data sequence, a database, a graphical representation, any other suitable data structure, or combinations thereof.

In one or more embodiments, the data are generated based on a formation measurement plan (FMP) by data acquisition tools depicted in FIG. 1.1 above. The FMP is a plan that defines the procedures for measuring a formation. In particular, the FMP specifies a type of data acquisition tools, the locations where the fluid samples are extracted, and formation properties that are measured where the fluids samples are extracted. Accordingly, the data are provided to the E&P computer system (118) and stored in the data repository (235) for analysis. The intermediate/final analysis results derived therefrom may include a fluid property distribution estimate (232), a detected fluid property gradient (233), and a petroleum system model (PSM) (234). The fluid property distribution estimate (232) is an estimate of the fluid property as a function of geographical locations in the geologic basin. In one or more embodiments, the fluid property is any property of a fluid. For example, a fluid property may be chemical composition, gas-oil ratio (GOR), density, viscosity, pressure, and/or other types of properties. The detected fluid property gradient (233) is an observed directional variation of the fluid property within the geologic basin. The petroleum system model (PSM) (234) is a mathematical model that describes spatial variations of an attribute of the geologic basin.

In one or more embodiments, the E&P tool (230) is configured to generate and calibrate the PSM (234), to adjust the formation measurement plan, to model the field operation based on the calibrated PSM (234), and to monitor/control the field operation based on a modeling result. In one or more embodiments, the E&P tool (230) performs such tasks using the method described in reference to FIG. 2 below. An example of using the E&P tool (230) to perform the field operation is shown in FIGS. 3.1, 3.2, 3.3, 3.4, 3.5, and 3.6 below.

In one or more embodiments, E&P computer system (118) includes the PSM generator (222) that is configured to generate the PSM (234). As noted above, the PSM (234) describes spatial variations of an attribute of the geologic basin. For example, the attribute includes a rock attribute (e.g., TOC, HI, etc.) of the rock formations in the geologic basin and a fluid attribute (e.g., composition, gas-oil ratio, distribution of hydrocarbon fractions, fluid density, fluid viscosity, saturation pressure, and identification of certain biomarkers, etc.) of the fluids in the geologic basin. In addition, the attribute of the geologic basin includes a geologic basin charging history, which describes the geological time when the fluids enters the rock formations. Over geological time, fluid mixing in a particular reservoir, or the degree of fluid compositional variation within the reservoir, is an indicator of the charging history of a hydrocarbon accumulation and the complexity of the hydrocarbon migration paths. Further, the attribute of the geologic basin may include a geologic basin thermal history, which describes temperature records of the rock formations at different geological times. In one or more embodiments, the PSM generator (222) generates the PSM (234) based on user input and geologic data set(s) collected by the data acquisition tools depicted in FIG. 1.1.

In one or more embodiments, E&P computer system (118) includes the simulator (223) that is configured to generate, by forward modeling using the PSM (234), the fluid property distribution estimate (232). For example, the simulator (223) may be a basin simulator, such as the aforementioned PETROMOD® simulator. In one or more embodiments, the fluid property distribution estimate (232) is an estimated spatial distribution of a fluid property (e.g., composition, density, viscosity, pressure, or other type of fluid property measured using DFA) of the fluids within a reservoir of the geologic basin.

In one or more embodiments, E&P computer system (118) includes the PSM calibration analyzer (225) that is configured to detect, from the fluid samples extracted from the rock formations, a fluid property gradient that is stored in the data repository (235) as the detected fluid property gradient (233). Specifically, the fluid property gradient represents a variation of fluid property versus spatial locations. In other words, the fluid property gradient describes how the fluid property changes spatially across the field. For example, the fluid property may be measured using DFA. Additional examples of the fluid property gradient include the GOR (gas-oil ratio) gradient, the asphaltene gradient, gravity induced compositional gradient, etc. In one or more embodiments, to obtain the fluid property and detect the fluid property gradient, the PSM calibration analyzer (225) uses one or more of near infrared optical absorption spectroscopy, visible-near infrared optical absorption spectroscopy, density measurement, viscosity measurement, hydrogen sulfide concentration measurement, nuclear magnetic resonance measurement, gas chromatography, mass spectroscopy, and measurement of variations of density by a controlled depressurization.

In one or more embodiments, the PSM calibration analyzer (225) is further configured to compare the fluid property distribution estimate (232) and the detected fluid property gradient (233) to generate a comparison result. Based on the comparison result, the PSM (234) and/or the formation measurement plan are iteratively adjusted to improve the matching between the fluid property distribution estimate (232) and the detected fluid property gradient (233). With the adjustment, the PSM (234) is referred to as the adjusted PSM (234). In one or more embodiments, the forward modeling based on the adjusted PSM (234) and/or the fluid sample extraction based on the adjusted formation measurement plan are repeated until the comparison result satisfies a pre-determined criterion. The PSM (234) is referred to as the calibrated PSM (234) when the comparison result satisfies a pre-determined criterion.

In one or more embodiments, the PSM calibration analyzer (225) performs the iterative adjustments and repeats the forward modeling/fluid sample extraction using the method described in reference to FIG. 2 below.

In one or more embodiments, E&P computer system (118) includes the field task engine (231) that is configured to generate a field operation control signal based at least on a result generated by the simulator (223) and the calibrated PSM (234). As noted above, the field operation equipment depicted in FIG. 1 above may be controlled by the field operation control signal. For example, the field operation control signal may be used to control drilling equipment, an actuator, a fluid valve, or other electrical and/or mechanical devices disposed about the field (100) depicted in FIG. 1.1 above.

Figure 4:
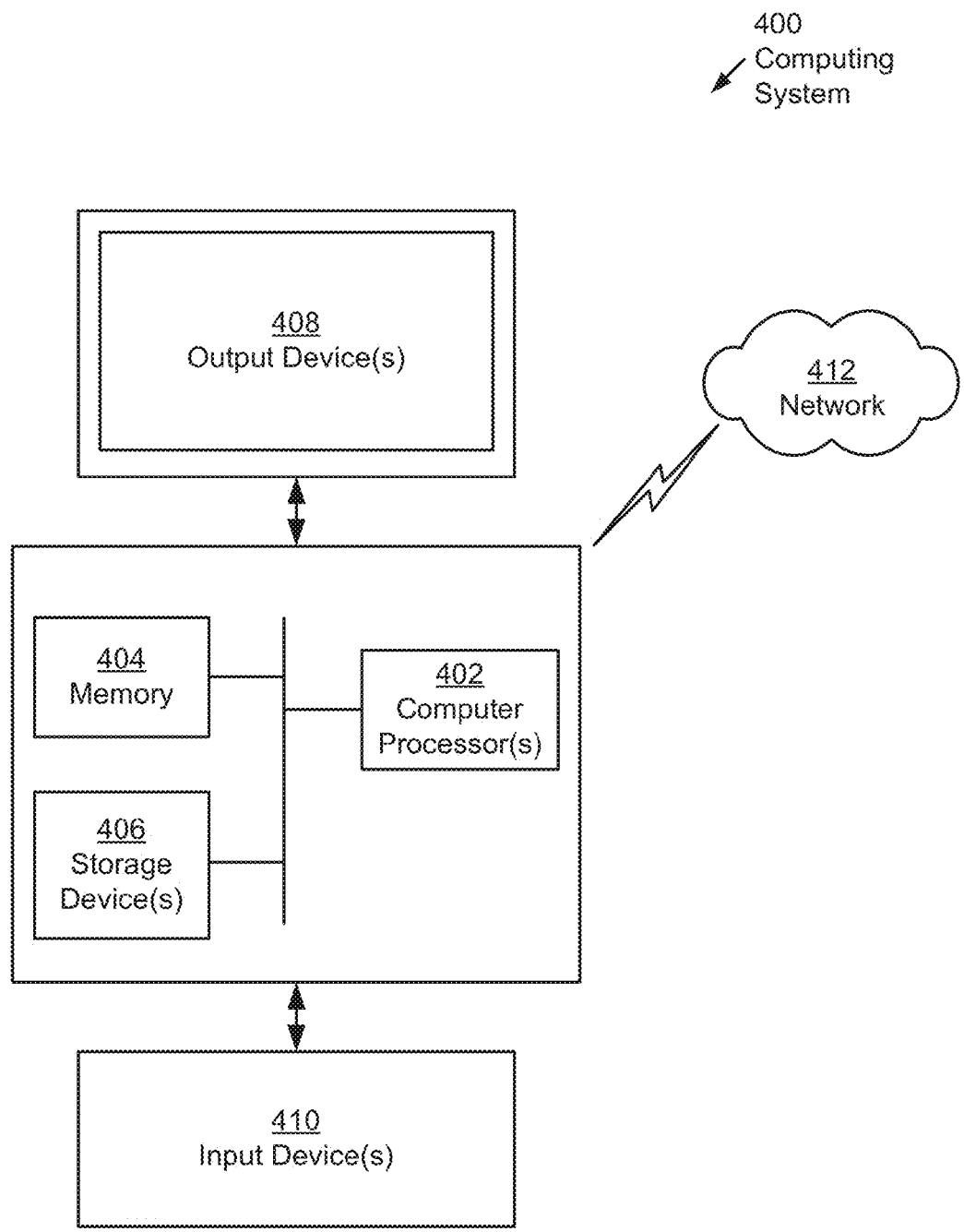
FIG. 4 shows a computing system in accordance with one or more embodiments.

The E&P computer system (118) may include one or more system computers, such as shown in FIG. 4 below, which may be implemented as a server or any conventional computing system. However, those skilled in the art, having benefit of this disclosure, will appreciate that implementations of various technologies described herein may be practiced in other computer system configurations, including hypertext transfer protocol (HTTP) servers, hand-held devices, multiprocessor systems, microprocessor-based or programmable consumer electronics, network personal computers, minicomputers, mainframe computers, and the like.

While specific components are depicted and/or described for use in the units and/or modules of the E&P computer system (118) and the E&P tool (230), a variety of components with various functions may be used to provide the formatting, processing, utility and coordination functions for the E&P computer system (118) and the E&P tool (230). The components may have combined functionalities and may be implemented as software, hardware, firmware, or combinations thereof.

FIG. 2 depicts an example method in accordance with one or more embodiments. For example, the method depicted in FIG. 2 may be practiced using the E&P computer system (118) described in reference to FIGS. 1.1 and 1.2 above. In one or more embodiments, one or more of the elements shown in FIG. 2 may be omitted, repeated, and/or performed in a different order. Accordingly, embodiments of the method and system for sandbox visibility should not be considered limited to the specific arrangements of elements shown in FIG. 2.

In Block 201, a petroleum system model (PSM) is generated or obtained that describes spatial variations of an attribute of a geologic basin containing rock formations and fluids reservoirs. In one or more embodiments, the PSM is initially generated using seismic data.

In Block 202, by forward modeling using the PSM, an estimate of a fluid property distribution of the fluids within a reservoir of the geologic basin is generated. In one or more embodiments, the forward modeling includes a thermal dynamic analysis based on a description of petroleum generating reactions. For example, the description may include a distribution of petroleum source rocks and activation energies, frequency factors, etc., of petroleum generating reactions. In one or more embodiments, the thermal dynamic analysis analyzes thermal dynamic properties of the fluids based on a Flory-Huggins-Zuo equation of state and a Yen-Mullins model, both of which are described in further details in the example shown in FIGS. 3.1-3.6 below. In one or more embodiments, the fluids is in a thermodynamic equilibrium. In one or more embodiments, the fluids is disturbed by reservoir filling from a source below the reservoir or from other processes yielding a disequilibrium.

In Block 203, based on a formation measurement plan (FMP), fluid samples are extracted from within at least one wellbore drilled through the rock formations. In one or more embodiments, the FMP specifies whether the fluid samples are extracted by an instrument disposed within a drilling system used to drill the wellbore or by an instrument conveyed in the wellbore by an armored electrical cable. In one or more embodiments, the FMP specifies the locations where the fluid samples are extracted. In one or more embodiments, the FMP specifies the formation properties (e.g., electrical resistivity, acoustic velocity, density, neutron hydrogen index, nuclear magnetic resonance relaxation time, nuclear magnetic resonance diffusion, etc.) that are measured where the fluids samples are extracted. In one or more embodiments, downhole instruments may be used to extract the fluid sample and measure the formation properties. In one or more embodiments, the FMP is designed (at least partly) based on predications of the PSM.

In Block 204, a fluid property gradient within the geologic basin is detected from the fluid samples. In one or more embodiments, the fluid samples are extracted from multiple locations (i.e., varying depths and lateral positions) within an accumulation of hydrocarbon in the geologic basin. Accordingly, the fluid property gradient is detected by characterizing the fluid samples across the varying depths and lateral positions using one or more of the techniques employed by the PSM calibration analyzer described in reference to FIG. 1.2 above. In one or more embodiments, the fluid property gradient may be detected in thermally equilibrated fluids or fluids in thermal disequilibrium. For example, detecting the fluid property gradient may include analyzing the fluid samples to determine whether hydrocarbons from different sources have mixed within the accumulation.

In Block 205, a comparison is made to determine whether the estimate of the fluid property distribution and the detected fluid property gradient match based on a pre-determined criterion. In one or more embodiments, the estimate of the fluid property distribution is analyzed to compute an estimated fluid property gradient. For example, the pre-determined criterion may include a percentage threshold that represents the maximum allowable difference between the estimated fluid property gradient and the detected fluid property gradient across the region where the detected fluid property gradient is found.

Accordingly, if the difference between the estimated fluid property gradient and the detected fluid property gradient, across the region where the detected fluid property gradient is found, exceeds the percentage threshold, a determination is made that the estimate of the fluid property distribution and the detected fluid property gradient do not match. As a result, the method proceeds to Block 207.

In Block 207, a determination is made as to whether to adjust PSM (or to adjust FMP) to improve the matching. If the determination is Yes, i.e., the determination is made to adjust the PSM, the method proceeds to Block 208 where the PSM is adjust before returning to Block 202 for the next iteration to improve the matching in Block 205. In one or more embodiments, the PSM is adjusted based on the formation properties (e.g., electrical resistivity, acoustic velocity, density, neutron hydrogen index, nuclear magnetic resonance relaxation time, nuclear magnetic resonance diffusion, etc.) that are measured where the fluids samples are extracted. For example, the fluid property-defining processes modeled by the PSM, such as the temp history of the SR, geochemical properties of the modeled kerogen, PVT behavior of the fluids, etc., are adjusted based on the measured formation properties.

In one or more embodiments, the formation properties are checked for compliance with data used in the PSM generator. For example, measured resistivity values are compared with estimated resistivity values derived from the PSM model. Deviations may be minimized by adjusting PSM parameters, which are known or tested by additional simulation runs to adjust the PSM in a desired direction, i.e., to minimize the deviations. For example, formation porosity may be reduced by reducing the initial porosity of the formation at sedimentation time or reducing the respective formation compaction stiffness parameters. Both parameters may not be known accurately and may be varied within some limits. Subsequently, the present day porosity within the formation may be reduced and, thus, according to common correlations and in case of absence of hydrocarbon fluids, improve the accuracy of the estimated resistivity.

Examples of adjusting the PSM are described in reference to FIGS. 3.1-3.6 below.

In contrast, if the determination in Block 207 is No, i.e., the determination is made to adjust the FMP, the method proceeds to Block 209 where the FMP is adjusted before returning to Block 203 for the next iteration to improve the matching in Block 205. In one or more embodiments, the instrument, the extracting location, and/or the type of formation properties to be measured are adjusted in the FMP. In one or more embodiments, the FMP is adjusted by determining a new location for extracting at least one additional fluid sample from an existing wellbore. In one or more embodiments, the FMP is adjusted by determining a new location for drilling at least one additional wellbore to extract additional fluid samples.

Returning to the discussion of Block 205, if the difference between the estimated fluid property gradient and the detected fluid property gradient, across the region where the detected fluid property gradient is found, is less than the percentage threshold, a determination is made that the estimate of the fluid property distribution and the detected fluid property gradient match. As a result, the method proceeds to Block 206.

In Block 206, based on the adjusted PSM, the field operation is performed within the geologic basin. In one or more embodiments, the spatial variations of the aforementioned attribute (e.g., rock attribute, fluid attribute, charging history and/or thermal history) of the geologic basin is analyzed to obtain information used for performing the field operation. For example, a prediction regarding a condition of biodegradation, heavy oil gradient, fault block migration, gas charge, bitumen coat, tar mat, and/or water washing may be generated by analyzing the spatial variations of the geologic basin attributes. In one or more embodiments, based on the prediction, a determination is made whether an accumulation of hydrocarbon within the geologic basin corresponds to a single reservoir compartment or multiple reservoir compartments separated by a barrier. For example, a fault, tar mat, shale break, cemented zone, and/or low permeability zone may act as the barrier(s) to separate multiple reservoir compartments. Based on information of the reservoir compartment structure, the field operation may be advantageously performed. An example of performing the field operation based on the adjusted PSM is described in reference to FIGS. 3.1, 3.2, 3.3, 3.4, 3.5, and 3.6 below.

FIGS. 3.1, 3.2, 3.3, 3.4, 3.5, and 3.6 show an example in one or more embodiments. In one or more embodiments, the example shown in these figures may be practiced using the E&P computer system shown in FIGS. 1.1 and 1.2, and the method described in reference to FIG. 2 above. The following example is for example purposes and not intended to limit the scope of the claims.

By way of further explanation of the various elements of the present disclosure based on the example shown in FIGS. 3.1, 3.2, 3.3, 3.4, 3.5, and 3.6, basin modeling is not deterministic, but requires a stochastic approach, that is, a number of plausible initial basin models (i.e., PSMs) may be generated and tested with respect to measurements obtained from the subsurface formations. One objective of integrating basin modeling with downhole fluid analyses (DFA) is to calibrate the PSM and reduce the uncertainty in modeling the fluid charging history.

The parameters in the PSM for basin modeling may include kerogen type, burial rate and geometry (spatial distribution) of the geological layers. For example, sediments may be initially deposited as substantially horizontal layers having defined or undefined areal extent. Fluid mixing in a particular reservoir, or the degree of fluid compositional variation within the reservoir, is an indicator of the charging history of a hydrocarbon accumulation and the complexity of the hydrocarbon migration paths. DFA measures fluid properties in situ with high spatial resolution and may provide useful information to reconstruct the charging history of any particular accumulation of hydrocarbon. The type of kerogen (hydrocarbon precursor) is a parameter in modeling the reservoir charging history, however, kerogen samples are rarely available. The kerogen type controls the type of hydrocarbon ultimately found in an accumulation. For example, "type I" kerogen has the highest atomic hydrogen to carbon ratio is the best known liquid hydrocarbon precursor and has the lowest sulfur content of the known kerogen types. "Type II" kerogen also produces predominantly liquid hydrocarbons and is also the most common type of kerogen found. "Type III" kerogen produces primarily hydrocarbon gases. Therefore, the type of kerogen that produced the accumulation under evaluation is inferred based on the present day composition measured with DFA and the thermal history of the accumulation. DFA results may be used as an indicator of the precursor kerogen type and the temperature (burial) history. Forward simulation or modeling may be performed on initial estimates of kerogen type to identify if the measured hydrocarbon composition from DFA is consistent with certain types of kerogen and certain temperature histories. For example, if there is a slow burial rate in some basins, the hydrocarbons tend to have a low GOR. When the burial rate is slow, the kerogen undergoes diagenesis at relatively low temperature and little gas is generated (i.e., there is not much hydrocarbon cracking) On the other hand, if there is a rapid burial, the kerogen will be subject to relatively high temperatures, thereby accelerating the cracking process. The resulting hydrocarbon will have a higher GOR. Overall hydrocarbon composition determined using DFA may also be used to indicate the origin of gas in a reservoir. For example, biogenic gas will contain at least 98% methane. The concentration of non-hydrocarbon species ($H_2S$, $CO_2$, $N_2$) measured with DFA may also be an indicator of the composition of the precursor kerogen. In performing kerogen identification, an initial estimate of kerogen type may be made based on the DFA results, as explained above. The initial estimate of kerogen type may be used in the basin model, e.g., the modeled thermal history, to generate an expected or estimated fluid composition ("forward modeled composition") in the accumulation under evaluation. The forward modeled composition is then compared to the composition determined by DFA. The initial model may be revised by adjusting either or both the initial kerogen type and the thermal history. The forward modeled composition may be determined again. The foregoing procedure may be repeated until the difference between the analyzed composition and the forward modeled composition falls below a selected threshold.

The initial model may also include descriptions of hydrocarbon source rock. Source rock descriptions may include estimates of total organic carbon (TOC) content, which is the weight fraction of non-carbonate carbon compounds in the source rock. Therefore, TOC may be used as an indicator of the amount of kerogen in the source rock. The source rock description may also include hydrocarbon index (HI) which is an indicator of the potential of the particular source rock to produce hydrocarbons through burial and maturation. HI may be determined by subjecting samples of source rock to pyrolysis or combustion to accelerate cracking, and relating the mass of hydrocarbons generated to the mass of organic carbon. The foregoing measurements for determining TOC and HI may be made on samples of the source rock in outcrops (if available) or from cores in drilled wells (if available) using a laboratory procedure known as RockEval. It is also possible to determine TOC from the interpretation of well log measurements (e.g., gamma-ray, neutron porosity, bulk density, acoustic velocities, and electrical resistivity). TOC and HI are input to the initial model as maps of their spatial distribution.

DFA performed at several locations, for example, various depths, within an accumulation may provide information about the extent of mixing of the hydrocarbons in the reservoir and the degree of compartmentalization, based on the variation in the measured fluid properties. In some cases, the properties of the hydrocarbons charged in the reservoir vary with time. If no mixing exists within the reservoir, large spatial variations in fluid composition within the accumulation may exist, in spite of apparent hydraulic continuity. A preliminary step is to discard the possibility that the observed fluid variations are due to gravity and/or thermal gradients. This is done by modeling the fluid with an equation of state considering the reservoir as a thermodynamic system in equilibrium. Compartmentalization within the reservoir and insufficient mixing time may be assessed, for instance, from a combined interpretation of petrophysical logs, downhole fluid composition measurements, pressure gradients and interference pressure transient tests. If an assessment is made that the variation in fluid properties throughout the reservoir is due to a variation of charging times, then a modification of the expulsion and migration events is made in the basin model.

Once a well has been drilled and new fluid composition and geological information become available from such well, the reservoir charge model may be updated. Updating the reservoir charge model may be performed by eliminating those models that do not correspond to the newly obtained information and/or new models may be generated that correspond with the newly obtained information. The charging history of a particular accumulation may be determined in compositional form, for example American Petroleum Institute (API) gravity, GOR, hydrocarbon component concentrations (e.g., $C_1$, $C_{2-5}$, $C_{6+}$). Thus, the updated models are used to predict a range of plausible fluid properties and DFA results at the locations of proposed new wells. The updated models may be tested by a direct comparison with actual DFA measurements from such wellbores during or after drilling. As more data are collected, the uncertainty in various part of the PSM (e.g., the geologic, fluid and charge models) is reduced. The models may be continuously calibrated against newly acquired data (e.g., from DFA, lab analyses, petrophysics, seismic, production tests, etc.). There will be a loop of DFA response prediction and calibration of the reservoir charging model, the geological model and of seismic inversion throughout the field exploration and appraisal stages as new data is acquired.

Certain hydrocarbon production issues may be overcome by proper planning of field development with consideration of physical processes prior to production concerning the amount, distribution, and properties of hydrocarbon species. Methods according to one or more embodiments may reduce the uncertainty of fluid type and composition likely to be encountered in subsurface rock formations at selected locations within a geologic basin. Reducing such uncertainty may reduce the cost of extracting petroleum from subsurface reservoirs and increase the efficiency thereof.

FIG. 3.1 shows an example geologic basin (310) where the calibrated PSM is used to model the tar mat (315) in the reservoir (312) that may impede hydrocarbon production. Specifically, FIG. 3.1 shows a schematic representation of the reservoir (312) that is capped by the seal (311) and charged (over geological timescales) with asphaltene contaminated oil under additional inflow of gas represented by the upward arrows. The asphaltene flocculation from hydrocarbons may form the tar mat (315) plugging reservoir pores and thus act as flow barriers. For example, the oil layer (214) may show a significant asphaltene gradient which is increasing to the bottom of the oil column due to gravity segregation with the tar mat (315) forming at the oil/water contact. The in-reservoir process of tar mat formation may also need up to a million years and is thus occurring on geological timescales modeled with PSM. The Production and injection wells should take into account the location and extent of the tar mat (315), otherwise production of hydrocarbons may be hindered or even inhibited. The risk of tar mat formation may be predicted with the PSM. The PSM is subsequently tested and improved in a calibration procedure with data from downhole fluid measurements.

Quantification of one or more of the following processes and data may be estimated using PSM Modeling and calibrated with information from downhole fluid sampling:

1. Overall hydrocarbon amounts charging the reservoir
2. Outgassing amounts or gas solubility in oil
3. Fluid properties variations, especially API and viscosity
4. Biodegradation
5. Asphaltene concentration and flocculation with determination of flocculation onset pressure
6. Risk and location of tar mat formation
7. Heavy oil and asphaltene gravity segregation and diffusion with compositional grading
8. Distribution of hydrocarbons including solid fractions such as asphaltenes
9. Time frames for fluid mixing and equilibration
10. Leaky reservoir seals discharging light hydrocarbons or gas from the reservoir One or more of the processes above may be coupled, e.g., biodegradation may cause gas generation with subsequent asphaltene flocculation. Amount and properties of the involved fluids may change continuously with ongoing degradation to causing gas to be trapped (e.g., gas cap A (313a), gas cap B (313b)) in the reservoir (312).

FIG. 3.2 shows a flow chart describing a combined workflow of PSM modeling with downhole fluid data gathering for an improved field development. As shown in FIG. 3.2, the PSM (320) is used in forward modeling to generate modeling result (321) related to reservoir charge history, charge composition, and secondary processes, such as biodegradation, asphaltene flocculation, etc. The downhole fluid data acquisition (322) is then performed to generate DFA result for comparing to the modeling result (321). Based on the comparison result, a decision (323) is made regarding whether to update the PSM (320) for calibration. For example, the PSM (320) may be updated based on additional fluid samples obtained and analyzed during the activity of design/update field development (324). In another example, the PSM (320), after calibration, may be used to provide better predication for un-drilled prospects (e.g., injection wells, production wells) (325).

By way of further discussion of the combined workflow, measurement of reservoir fluid gradients vertically and laterally in a reservoir captures a 'snapshot' of the evolution of fluid processes that take place over geologic time. DFA enables the reservoir fluid profiling to be performed in an efficient manner. Dramatically different fluid distributions are obtained in different reservoirs and may be categorized in terms of the extent of thermodynamic equilibrium attained. Factors that influence the equilibration process include the geologic timing of reservoir charging, possible secondary fluid processes, the extent of convection versus diffusion, the size of the equilibrating fluid component, and the size of the reservoir. In various geologic basins, reservoirs may span a very large range, from very young reservoirs (Pliocene) that evidently exhibit stochastic distributions of solution methane over relatively small distances to old reservoirs (Lower Cretaceous) with equilibrated asphaltene clusters over immense distances. For each class of reservoir evolution, very different production concerns are identified. Characterization of the fluid columns in terms of (dissolved) solids, liquids and (dissolved) gases is found to be informative for several reasons including 1) the large gradients associated with the different (dissolved) phases and 2) the production concerns associated with the different phases. In particular, understanding the disposition of the asphaltenes in the reservoir may be accomplished using the Flory-Huggins-Zuo Equation of State for asphaltenes, with its reliance on the Yen-Mullins model of asphaltene nanoscience. See, for example, Mullins, O. C., The asphaltenes, Annual Review of Analytical Chemistry, 2011, 4:393-418. The ability to model three crude oil phases within a proper thermodynamic framework enables the ability to track the evolution of the three phases in the reservoir, bringing into view simplifying systematics that improve risk management in production of the reservoirs.

Reservoir fluid complexities are revealed with a combination of PSM and DFA on wireline formation testing tools (WFT). The combination of PSM and DFA enables simplifying views of the processes that give rise to the fluid complexities. In turn, reservoirs and their fluids may be categorized by the extent of progression of the fluid processes. The real time analysis of DFA data enables the complexity of the WFT job to be matched to the complexity of the fluid column thereby optimizing the logging runs. The growing list of DFA measurements include compositional analysis and gas-oil ratio (GOR), relative asphaltene content, $CO_2$, fluorescence, density and viscosity. From a standpoint of fluid gradient analysis, both vertical and lateral, the variation is often contained within the description of the content of dissolved gas, liquid and dissolved solid (asphaltenes) in the reservoir fluid. The largest variations in the reservoir fluids often correspond to the characterization of different (dissolved) thermodynamic phases. For example, crude oils with high GOR often exhibit substantial GOR gradients as well as heavy end gradients in an equilibrium state and mobile heavy oils exhibit enormous asphaltene gradients in their equilibrium state. Smaller equilibrium fluid gradients, for example in low GOR black oils, may still be measured accurately and may still be quite useful. Moreover, hydrocarbon phase separation in reservoir fluids is performed, such as a separate gas phase, a separate asphaltenic phase (bitumen, tar etc), or both. Often, such a phase separation magnifies the importance of fluid gradients, and provides a separate set of measurements on the second phase (whether gas or tar) to constrain a proper description of the reservoir fluids.

In the combined work flow shown in FIG. 3.2, the PSM (320) may be used in thermodynamic modeling of the reservoirs fluids that is coupled with DFA measurements to characterize the extent or lack thereof of thermodynamic equilibrium. The combination of PSM and DFA allows the dynamics of reservoir fluids to be determined. For gas-liquid equilibria, the cubic equation of state (e.g., Peng-Robinson EoS) may be used for analysis. Until recently, thermodynamic modeling of asphaltenes gradients in reservoir fluids has not been available. The reason is that even the size of asphaltene molecules had been unknown let alone possible nanocolloidal asphaltenes particles in crude oils. In the combined work flow shown in FIG. 3.2, the Yen-Mullins model may be used to specify the dominant molecular and colloidal structures of asphaltenes in laboratory solvents as well as in reservoir crude oils. With the asphaltene size determined, the effect of gravity may be incorporated into an equation of state, such as the Flory-Huggins-Zuo (FHZ) EoS. In the thermodynamic modeling process for the reservoir fluids, a cubic equation of state is used to model the gas-liquid equilibria giving gradients in GOR, saturation pressures, etc. The FHZ EoS is then used to model the asphaltene gradients using the Yen-Mullins model for asphaltenes sizes and using the GOR gradients for the solubility term in the FHZ EoS.

DFA may be performed to understand the gradients of reservoir fluids especially for dissolved gases, liquids and dissolved solids. The DFA data are then interpreted with the cubic EoS and the FHZ EoS giving a full three phase, equilibrium characterization of the reservoir fluids. The combination of DFA and thermodynamic modeling, as described in the combined workflow, may be used to address many reservoir concerns, such as reservoir connectivity, mapping of fault block migration, heavy oil gradients with extension into tar mat formation.

In reservoir fluid processes of interest, different fluids enter the reservoir. The different fluids may occur either from multiple reservoir charging events, or from a single charge where the properties of the charge fluid evolve over time. In either case, the different reservoir fluids provide the data required for the combined workflow shown in FIG. 3.2. A consideration for oil charging into reservoirs especially those with resident hydrocarbons, is that in general the reservoirs do not equilibrate during the charge process. The oil charging process into reservoirs is different from a distillation tower containing plates with bubble caps to ensure gas-liquid equilibration. Instead, the fluids charging into reservoirs are much more likely to stack without mixing. Reservoir fluids often travel in a charge plane, a largely two dimensional object, while reservoirs are three dimensional. Because of the dimensionality difference, the fluids charging into reservoirs do not have the contact area to mix with resident fluids except in the charge plane. As a result, tar is often encountered in charge planes and may be attributed to the mix of incompatible fluids there, such as resident oil and a gas charge.

FIG. 3.3 shows an example screenshot A (330) of a migration analysis performed by an example basin simulator, such as PetroMod® simulator. For example, the basin simulation software package may be used to simulate:

1. The timing of hydrocarbon generation within the source rock(s)
2. The timing of hydrocarbon expulsion from the source rock(s)
3. The composition of hydrocarbons generated and expelled from the source rock(s)
4. The timing and directions of hydrocarbon migration from the source rock(s) to the traps(s)

As shown in FIG. 3.3, the screenshot A (330) corresponds to a cross section of a geologic basin (310) where hydrocarbons are generated within the source rock (333) as a function of the reconstructed/modeled thermal history of the geologic basin (310). The arrows (e.g., arrow (336)) show the migration through non-reservoir quality rock (not shown) where the hydrocarbons migrate very slowly over geological periods of time, up to several million years. As an example, the flow lines (e.g., flow line (337)) associated with the hydrocarbon accumulation (331) represent the simulated flow of hydrocarbons within the reservoir layer towards the highest point, which becomes the trapping structure of the hydrocarbon accumulation (331). Within the reservoir, the migration is very fast (in geological terms).

Salt acts as a migration barrier and as a perfect seal when sealing reservoirs. However, salt itself behaves as a very slow fluid, so holes in salt layers (e.g., salt windows open for migration (332)) may open over geological time scales of millions of years. When salt moves away (e.g., starting to form salt domes), the holes may not be sealing anymore and allow for hydrocarbon fluids to pass. Such geological process is reflected in the salt layer and diapers (334) and modeled in the PSM.

The salt layer and diapers (e.g., salt layer and diapers (334)) act as a barrier to hydrocarbon migration. In the example shown, the salt has moved and changed thickness through geological time. As a result, windows (e.g., salt windows open for migration (332)) formed through which hydrocarbons migrate into shallower reservoir rocks to form hydrocarbon accumulation (e.g., hydrocarbon accumulation (331)). The PSM models the timing of salt window creation, in part driving the charge history of accumulations above the salt layer.

FIG. 3.4 shows a screenshot B (340), which is a more detailed view of the hydrocarbon accumulation (331) and associated flow lines, such as the flow line (337). The screenshot B (340) corresponds to the present day geometry. However, the geometric evolution, through geological time, of the geometric structure shown in FIG. 3.4 may also be modeled using the basin simulator. In particular, the flow of hydrocarbons through geological time into the trapping structure of the hydrocarbon accumulation (331) may be modeled.

FIG. 3.5 shows a screenshot C (350) of modeled charge history of the hydrocarbon accumulation (331) that is generated using the PSM (320) during the combined workflow shown in FIG. 3.2. During the workflow iteration, any inconsistencies found between the downhole fluid data and the modeled charge history triggers an adjustment (i.e., calibration) of the PSM model (320). In the charge history plot, the vertical axis represents the accumulated liquid volume of the hydrocarbon accumulation (331), while the horizontal axis represents the age of the geologic basin (310) from 100 Ma through 0 Ma (i.e., present day). The charge history plot indicates that there is charge toward the hydrocarbon accumulation (331) until present day. However, the accumulated volumes are declining since 7 Ma. The declination is an indication that the downhole fluid measurement parameters may be un-equilibrated.

FIG. 3.6 shows a data plot (360) of fluid optical density versus depth where asphaltene fluid samples were obtained from the geologic basin (310). In the data plot (360), measured downhole data are represented based on the legend (361) and the modeled fluid property is represented by the solid equilibrium curve. Based on the data plot (360), most asphaltene measurements fall near or on the solid equilibrium curve, which indicates that the asphaltenes are substantially equilibrated according to the PSM (320). The equilibrium indicates connectivity throughout the region where asphaltene fluid samples were obtained.

Embodiments may be implemented on virtually any type of computing system regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory, and input and output device(s) to perform one or more embodiments. For example, as shown in FIG. 4, the computing system (400) may include one or more computer processor(s) (402), associated memory (404) (e.g., random access memory (RAM), cache memory, flash memory, etc.), one or more storage device(s) (406) (e.g., a hard disk, an optical drive such as a compact disk (CD) drive or digital versatile disk (DVD) drive, a flash memory stick, etc.), and numerous other elements and functionalities. The computer processor(s) (402) may be an integrated circuit for processing instructions. For example, the computer processor(s) may be one or more cores, or micro-cores of a processor. The computing system (400) may also include one or more input device(s) (410), such as a touchscreen, keyboard, mouse, microphone, touchpad, electronic pen, or any other type of input device. Further, the computing system (400) may include one or more output device(s) (408), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system (400) may be connected to a network (412) (e.g., a local area network (LAN), a wide area network (WAN) such as the Internet, mobile network, or any other type of network) via a network interface connection (not shown). The input and output device(s) may be locally or remotely (e.g., via the network (412)) connected to the computer processor(s) (402), memory (404), and storage device(s) (406). Many different types of computing systems exist, and the aforementioned input and output device(s) may take other forms.

Software instructions in the form of computer readable program code to perform embodiments may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments.

Further, one or more elements of the aforementioned computing system (400) may be located at a remote location and connected to the other elements over a network (412). Further, embodiments may be implemented on a distributed system having a plurality of nodes, where each portion may be located on a different node within the distributed system. In one embodiment, the node corresponds to a distinct computing device. The node may correspond to a computer processor with associated physical memory. The node may correspond to a computer processor or micro-core of a computer processor with shared memory and/or resources.

While one or more embodiments have been described with respect to a limited number of embodiments, those skilled in the art, having benefit of this disclosure, will appreciate that other embodiments may be devised which do not depart from the scope as disclosed herein. Accordingly, the scope should be limited only by the attached claims.

What is claimed is:

1. A method for performing a field operation within a geologic basin having a plurality of rock formations and a reservoir comprising fluids, comprising:
    determining, from a plurality of fluid samples, at least one asphaltene size;
    generating, by forward modeling using a petroleum system model (PSM), an estimate of a fluid property distribution of a fluid within the reservoir of the geologic basin, wherein the estimate uses an effect of gravity determined from the at least one asphaltene size;
    detecting, from the plurality of fluid samples, a fluid property gradient representing a location-dependent variation of fluid property within the geologic basin, wherein the plurality of fluid samples is extracted from a plurality of locations within at least one wellbore drilled through the plurality of rock formations;
    comparing the estimate of the fluid property distribution with the detected fluid property gradient to generate a comparison result;
    iteratively adjusting, based on the comparison result, the PSM to generate an adjusted PSM;
    analyzing, based on the adjusted PSM, spatial variations of an attribute of the geologic basin to predict at least one condition selected from a group consisting of heavy oil gradient, fault block migration, gas charge, bitumen coat, and tar mat;
    determining, based on the at least one predicted condition, whether an accumulation of hydrocarbon within the geologic basin corresponds to a single reservoir compartment or a plurality of reservoir compartments separated by a barrier; and
    performing the field operation within the geologic basin based on whether the accumulation of hydrocarbon within the geologic basin corresponds to the single reservoir compartment or the plurality of reservoir compartments.

2. The method of claim 1, further comprising: repeating, in response to the adjusting, the forward modeling until the comparison result satisfies a pre-determined criterion.

3. The method of claim 1, further comprising: extracting, based on a formation measurement plan, the plurality of fluid samples from within the at least one wellbore drilled through the rock formations.

4. The method of claim 1, wherein detecting the fluid property gradient is performed from information describing the plurality of fluid samples.

5. The method of claim 1, further comprising analyzing, based on the adjusted PSM, the spatial variations of the attribute of the geologic basin to:
predict biodegradation and subsequent asphaltene flocculation, and
further determine, based on the predicted biodegradation and subsequent asphaltene flocculation, whether the accumulation of hydrocarbon within the geologic basin corresponds to the single reservoir compartment or the plurality of reservoir compartments separated by the barrier.

6. The method of claim 1,
wherein the PSM describes spatial variations of an attribute of the geologic basin, and
wherein the attribute comprises at least one selected from a group consisting of a rock attribute of the plurality of rock formations, a fluid attribute of the fluids, a fluid charge history of the geologic basin, and a geologic basin thermal history.

7. The method of claim 1, further comprising:
measuring, where the plurality of fluid samples are extracted, a formation property comprising at least one selected from a group consisting of electrical resistivity, acoustic velocity, density, neutron hydrogen index, nuclear magnetic resonance relaxation time and nuclear magnetic resonance diffusion,
wherein the adjusting the PSM is further based on the at least one measured formation property.

8. The method of claim 1,
wherein the forward modeling comprises a thermal dynamic analysis based on a description of petroleum generating reactions including distribution of activation energies;
frequency factors; and
a description of one or more petroleum source rocks, and
wherein the description of a petroleum source rock comprises a group consisting of total organic carbon content and hydrocarbon index.

9. The method of claim 1, further comprising:
iteratively adjusting, based on the comparison result, a formation measurement plan, wherein the plurality of fluid samples is extracted based on the formation measurement plan; and
repeating, in response to the adjusting, the extracting until the comparison result satisfies the pre-determined criterion, and
wherein adjusting the formation measurement plan comprises at least one selected from a group consisting of determining a location for drilling an additional wellbore and determining a location for extracting an additional fluid sample from an existing wellbore.

10. The method of claim 1,
wherein the plurality of locations comprises at least one selected from a group consisting of a plurality of depths and a plurality of lateral positions, and
wherein detecting the fluid property gradient comprises analyzing the plurality of fluid samples to determine whether hydrocarbons from a plurality of sources have mixed within the accumulation.

11. A system for performing a field operation within a geologic basin having a plurality of rock formations and a reservoir comprising fluids, comprising:
a downhole instrument disposed within at least one wellbore drilled through the rock formations, wherein the downhole instrument is configured to extract, based on a formation measurement plan, a plurality of fluid samples from within the at least one wellbore;
a field equipment configured to perform the field operation; and
an exploration and production (E&P) tool coupled to the downhole instrument and the field equipment, and comprising:
a computer processor;
memory storing instructions executed by the computer processor, wherein the instructions comprise:
a simulator configured to generate, by forward modeling using the PSM, an estimate of a fluid property distribution of the fluids within a reservoir of the geologic basin, wherein the estimate uses an effect of gravity determined from at least one asphaltene size; and
a PSM calibration analyzer configured to:
detect, from the plurality of fluid samples, a fluid property gradient representing a variation of fluid property with respect to spatial locations within the geologic basin;
compare the estimate of the fluid property distribution with the detected fluid property gradient to generate a comparison result; and
iteratively adjust, based on the comparison result, the PSM to generate an adjusted PSM,
wherein the instructions, when executed, cause the computer processor to:
determine, from the plurality of fluid samples, the at least one asphaltene size;
analyze, based on the adjusted PSM, spatial variations of an attribute of the geologic basin to predict at least one condition selected from a group consisting of heavy oil gradient, fault block migration, gas charge, bitumen coat, and tar mat; and
determine, based on the at least one predicted condition, whether an accumulation of hydrocarbon within the geologic basin corresponds to a single reservoir compartment or a plurality of reservoir compartments separated by a barrier; and
a repository for storing the PSM,
wherein, in response to the iterative adjusting, the forward modeling is repeated until the comparison result satisfies a pre-determined criterion, and
wherein the field operation within the geologic basin is performed based on whether the accumulation of hydrocarbon within the geologic basin corresponds to the single reservoir compartment or the plurality of reservoir compartments.

12. The system of claim 11, wherein the simulator is further configured to analyze, based on the adjusted PSM, the spatial variations of the attribute of the geologic basin to:
predict biodegradation and subsequent asphaltene flocculation, and
further determine, based on the predicted biodegradation and subsequent asphaltene flocculation, whether the accumulation of hydrocarbon within the geologic basin corresponds to the single reservoir compartment or the plurality of reservoir compartments separated by the barrier.

13. The system of claim 11, wherein the instructions further comprise:
a petroleum system model (PSM) generator configured to generate the PSM that describes spatial variations of an attribute of the geologic basin, wherein the attribute comprises at least one selected from a group consisting of a rock attribute of the rock formations, a fluid attribute of the fluids, and a geological time when the fluids enter the rock formations.

14. The system of claim 11,
wherein the downhole instrument comprises at least one selected from a group consisting of an instrument disposed within a drilling system used to drill the wellbore and an instrument conveyed in the wellbore by an armored electrical cable, and
wherein the downhole instrument is further configured to measure, where the plurality of fluid samples is extracted, a formation property comprising at least one selected from a group consisting of electrical resistivity, acoustic velocity, density, neutron hydrogen index, nuclear magnetic resonance relaxation time and nuclear magnetic resonance diffusion, and
wherein the adjusting the PSM is further based on the at least one measured formation property.

15. The system of claim 11,
wherein detecting the fluid property gradient comprises performing at least one selected from a group consisting of near infrared optical absorption spectroscopy, visible-near infrared optical absorption spectroscopy, density measurement, viscosity measurement, hydrogen sulfide concentration measurement, nuclear magnetic resonance measurement, gas chromatography, mass spectroscopy, and measurement of variations of density by a controlled depressurization.

16. The system of claim 11,
wherein the forward modeling comprises a thermal dynamic analysis based on a description of petroleum generating reactions including distribution of activation energies;
frequency factors; and a description of one or more petroleum source rocks, and
wherein the description of a petroleum source rock comprises a group consisting of total organic carbon content and hydrocarbon index.

17. The system of claim 11, wherein the PSM calibration analyzer is further configured to:
iteratively adjust, based on the comparison result, the formation measurement plan,
wherein, in response to the iterative adjusting, the extracting of the plurality of fluid samples and the detecting of the fluid property gradient from the plurality of fluid samples are repeated until the comparison result satisfies a pre-determined criterion.

18. The system of claim 17,
wherein extracting the plurality of fluid samples is from a plurality of locations within an accumulation of hydrocarbon,
wherein detecting the fluid property gradient comprises analyzing the plurality of fluid samples to determine whether hydrocarbons from a plurality of sources have mixed within the accumulation, and
wherein adjusting the formation measurement plan comprises at least one selected from a group consisting of determining a location for drilling an additional wellbore and determining a location for extracting an additional fluid sample from an existing wellbore.

19. A non-transitory computer readable medium storing instructions for performing a field operation within a geologic basin having rock formations and reservoirs containing fluids, the instructions, when executed by a computer processor comprising functionality for:
determining, from a plurality of fluid samples, at least one asphaltene size;
generating, by forward modeling using a petroleum system model (PSM), an estimate of a fluid property distribution of a fluid within the reservoir of the geologic basin wherein the estimate uses an effect of gravity determined from the at least one asphaltene size;
detecting, from the plurality of fluid samples, a fluid property gradient representing a variation of fluid property with respect to spatial locations within the geologic basin, wherein the plurality of fluid samples are extracted from within at least one wellbore drilled through the plurality of rock formations;
comparing the estimate of the fluid property distribution with the detected fluid property gradient to generate a comparison result;
iteratively adjusting, based on the comparison result, the PSM to generate an adjusted PSM;
analyzing, based on the adjusted PSM, spatial variations of an attribute of the geologic basin to predict at least one condition selected from a group consisting of heavy oil gradient, fault block migration, gas charge, bitumen coat, and tar mat;
determining, based on the at least one predicted condition, whether an accumulation of hydrocarbon within the geologic basin corresponds to a single reservoir compartment or a plurality of reservoir compartments separated by a barrier; and
performing the field operation within the geologic basin based on whether the accumulation of hydrocarbon within the geologic basin corresponds to the single reservoir compartment or the plurality of reservoir compartments.

20. The non-transitory computer readable medium of claim 19, the instructions, when executed by the computer processor further comprising functionality for analyzing, based on the adjusted PSM, the spatial variations of the attribute of the geologic basin to:
predict biodegradation and subsequent asphaltene flocculation, and
further determine, based on the predicted biodegradation and subsequent asphaltene flocculation, whether the accumulation of hydrocarbon within the geologic basin corresponds to the single reservoir compartment or the plurality of reservoir compartments separated by the barrier.

* * * * *